United States Patent
Muramatsu et al.

(10) Patent No.: US 9,741,583 B2
(45) Date of Patent: Aug. 22, 2017

(54) SUBSTRATE TREATMENT METHOD, COMPUTER READABLE STORAGE MEDIUM AND SUBSTRATE TREATMENT SYSTEM

(71) Applicant: Tokyo Electron Limited, Tokyo (JP)

(72) Inventors: Makoto Muramatsu, Koshi (JP); Takahiro Kitano, Koshi (JP); Tadatoshi Tomita, Koshi (JP); Gen You, Koshi (JP); Takanori Nishi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/129,000

(22) PCT Filed: Apr. 16, 2015

(86) PCT No.: PCT/JP2015/061674
§ 371 (c)(1),
(2) Date: Sep. 26, 2016

(87) PCT Pub. No.: WO2015/163225
PCT Pub. Date: Oct. 29, 2015

(65) Prior Publication Data
US 2017/0133235 A1    May 11, 2017

(30) Foreign Application Priority Data
Apr. 25, 2014  (JP) .................. 2014-091741

(51) Int. Cl.
*H01L 21/311* (2006.01)
*H01L 21/308* (2006.01)
(Continued)

(52) U.S. Cl.
CPC .......... *H01L 21/3086* (2013.01); *G03F 7/091* (2013.01); *G03F 7/16* (2013.01);
(Continued)

(58) Field of Classification Search
None
See application file for complete search history.

(56) References Cited

U.S. PATENT DOCUMENTS

| | | | |
|---|---|---|---|
| 8,900,468 B2* | 12/2014 | Kim | G03F 7/0035 216/46 |
| 2014/0061154 A1* | 3/2014 | Kim | G03F 7/0035 216/49 |
| 2015/0255271 A1* | 9/2015 | Muramatsu | H01L 21/0271 355/27 |

FOREIGN PATENT DOCUMENTS

| | | |
|---|---|---|
| JP | 2010-522643 A | 7/2010 |
| JP | 2011-522707 A | 8/2011 |
| JP | 2013-207101 A | 10/2013 |

OTHER PUBLICATIONS

International Search Report of the International Searching Authority mailed Jul. 21, 2015 for the corresponding International application No. PCT/JP2015/061674 (and English translation).

(Continued)

*Primary Examiner* — Angel Roman
(74) *Attorney, Agent, or Firm* — Posz Law Group, PLC

(57) ABSTRACT

A substrate treatment method includes: forming a plurality of circular patterns of a resist film on a substrate; thereafter applying a first block copolymer; then phase-separating the first block copolymer into a hydrophilic polymer and a hydrophobic polymer; thereafter selectively removing the hydrophilic polymer; then selectively removing the resist film from a top of the substrate; thereafter applying a second block copolymer to the substrate; then phase-separating the second block copolymer into a hydrophilic polymer and a hydrophobic polymer; and thereafter selectively removing the hydrophilic polymer from the phase-separated second block copolymer. A ratio of a molecular weight of the (Continued)

hydrophilic polymer in the first block copolymer and the second block copolymer is 20% to 40%.

9 Claims, 17 Drawing Sheets

(51) Int. Cl.
| | |
|---|---|
| H01L 21/306 | (2006.01) |
| H01L 21/027 | (2006.01) |
| G03F 7/09 | (2006.01) |
| G03F 7/16 | (2006.01) |
| G03F 7/20 | (2006.01) |
| G03F 7/38 | (2006.01) |
| G03F 7/30 | (2006.01) |
| G03F 7/40 | (2006.01) |
| B82Y 40/00 | (2011.01) |
| B82Y 10/00 | (2011.01) |

(52) U.S. Cl.
CPC ............... *G03F 7/168* (2013.01); *G03F 7/20* (2013.01); *G03F 7/30* (2013.01); *G03F 7/38* (2013.01); *G03F 7/40* (2013.01); *H01L 21/0276* (2013.01); *H01L 21/30604* (2013.01); *B82Y 10/00* (2013.01); *B82Y 40/00* (2013.01); *Y10S 977/887* (2013.01); *Y10S 977/943* (2013.01)

(56) References Cited

OTHER PUBLICATIONS

Ralph R. Dammel, "Cost-Effective Sub-20 nm Lithography: Smart Chemicals to the Rescue", Journal of Photopolymer Science and Technology, vol. 24, No. 1, Jan. 2011, pp. 33-42, Hong Kong.

* cited by examiner

SUBSTRATE TREATMENT METHOD, COMPUTER READABLE STORAGE MEDIUM AND SUBSTRATE TREATMENT SYSTEM

CROSS REFERENCE TO RELATED APPLICATIONS

This application is based upon and claims the benefit of priority of the prior Japanese Patent Application No. 2014-091741, filed in Japan on Apr. 25, 2014, the entire contents of which are incorporated herein by reference.

TECHNICAL FIELD

The present invention relates to a substrate treatment method, a computer-readable storage medium and a substrate treatment system, using a block copolymer containing a hydrophilic (polar) polymer having a hydrophilic property (polarity) and a hydrophobic (nonpolar) polymer having a hydrophobic property (no polarity).

BACKGROUND ART

For example, in a manufacturing process of a semiconductor device, photolithography processing is performed in which a resist coating treatment of applying a resist solution onto, for example, a semiconductor wafer (hereinafter, referred to as a "wafer") to form a resist film, exposure processing of exposing the resist film to a predetermined pattern, a developing treatment of developing the exposed resist film and so on are performed in sequence to form a predetermined resist pattern on the wafer. Then, using the resist pattern as a mask, an etching treatment is performed on a film to be treated on the wafer and a removal treatment of the resist film is then performed, to form a predetermined pattern in the film to be treated.

Incidentally, miniaturization of the above-described pattern of the film to be treated is required in recent years for higher integration of the semiconductor device. Therefore, miniaturization of the resist pattern is in progress and, for example, the wavelength of light for the exposure processing in the photolithography processing is being reduced. However, there are technical and cost limits in reducing the wavelength of an exposure light source, and it is now difficult to form a fine resist pattern at a level of, for example, several nanometers only by the method of increasingly reducing the wavelength of light.

Hence, there is a proposed wafer treatment method using a block copolymer composed of two kinds of polymers (Non-Patent Document 1). In this method, first, a resist pattern is formed on an anti-reflection film of the wafer, and then a neutral layer having an intermediate affinity to a hydrophilic polymer and a hydrophobic polymer is formed on the anti-reflection film and the resist pattern. Thereafter, the neutral layer on the resist pattern is removed using the resist pattern as a mask, and then the resist pattern itself is also removed. Thus, a pattern of the neutral layer is formed on the anti-reflection film of the wafer, and then a block copolymer is applied onto the anti-reflection film and the pattern-formed neutral layer. Then, the hydrophilic polymer and the hydrophobic polymer are phase-separated from the block copolymer so that the hydrophilic polymer and the hydrophobic polymer are alternately and regularly arrayed on the neutral layer.

Thereafter, by removing, for example, the hydrophilic polymer, a fine pattern of the hydrophobic polymer is formed on the wafer. Then, using the pattern of the hydrophobic polymer as a mask, an etching treatment of the film to be treated is performed to thereby form a predetermined pattern in the film to be treated.

Incidentally, the pattern formation using the block copolymer is used also when forming a contact hole being a fine through hole for performing wiring between stacked wafers in a three-dimensional integration technology of stacking devices in three dimensions. This contact hole is a columnar hole pattern vertical to the upper surface of the wafer, and is formed by a so-called hole shrink process using the block copolymer.

In the case of forming contact holes by the hole shrink process using the block copolymer, first, columnar hole patterns 601 are formed of a resist film 606 on the wafer, for example, as illustrated in FIG. 23. Then, the block copolymer is applied to the wafer on which the hole patterns 601 are formed. Thereafter, the block copolymer is phase-separated into a hydrophilic polymer and a hydrophobic polymer. Thus, in the hole patterns 601 of the resist film 600 formed on the wafer W, the block copolymer is phase-separated into columnar hydrophilic polymers 602 and cylindrical hydrophobic polymers 603 concentric with the hole patterns 601 as illustrated in FIG. 24 and FIG. 25.

Subsequently, for example, by removing the hydrophilic polymers 602 located inside the concentric circles, hole patterns having a smaller diameter than that of the hole pattern 601 of the resist film 600 are formed of the remaining hydrophobic polymers 603. Then, by performing an etching treatment using the hydrophobic polymers 603 as masks, the contact holes being fine through holes are formed on the wafer.

PRIOR ART DOCUMENT

Patent Document

[Non-Patent Document 1] "Cost-Effective Sub-20 nm Lithography: Smart Chemicals to the Rescue", Ralph R. Dammel, Journal of Photopolymer Science and Technology Volume 24, Number 1 (2011) 33-42

DISCLOSURE OF THE INVENTION

Problems to be Solved by the Invention

Incidentally, higher density of capacitors in a DRAM is required with higher performance of the DRAM. The capacitors are formed by the above-described hole patterns, and therefore narrowing the pitch of reducing the distance between the hole patterns for higher density of capacitors.

However, in the above-described hole shrink process, it is possible to reduce the diameter of the hole pattern, but it is not impossible to narrow the pitch between the hole patterns because the pitch itself between the hole patterns is rate-controlled by the arrangement of hole patterns 601 of the resist film 600. In addition, the pitch between the hole patterns 601 of the resist film 600 has a limit of, for example, about 90 nm and cannot satisfy the pitch required for higher density of the capacitors in the DRAM.

Hence, there is an examined method of narrowing the pitch between the hole patterns by applying a block copolymer onto the wafer W on which guides of predetermined patterns are formed, then phase-separating the block copolymer to thereby phase-separate, for example, a hydrophilic polymer in a space between the guides, and removing the hydrophilic polymer. In a concrete method of narrowing the pitch, a plurality of columnar hole patterns 601 as illustrated in FIG. 23 are formed of the resist film 600 on the wafer W. In this event, the hole patterns 601 are arranged in a lattice form at regular intervals and pitches P between centers of the vertically or horizontally adjacent hole portions 601 are about 90 nm. Further, a diameter Q of each of the hole portions 601 is, for example, about 45 nm. Then, as illustrated in FIG. 24, an oxide film 610 is formed on the entire surface of the resist film 600 using ALD (Atomic Layer Deposition) or the like. As the oxide film 610, for example, SiO2 (silicon oxide) is used. In this event, the film thickness of the oxide film 610 is, for example, about 10 nm, and the inner diameter of the hole pattern 601 becomes about 25 nm due to the oxide film 610. Note that, as illustrate in FIG. 24, a film to be treated K is formed on the upper surface of the wafer W, and the resist film 600 is formed on the film to be treated K.

Then, an etching treatment is performed using the resist film 600 as a mask to transfer the hole patterns 601 of the resist film 600 to the film to be treated K, for example, as illustrated in FIG. 25. Note that since the oxide film 610 of 10 nm is formed in the hole patterns, the diameter of the hole patterns to be transferred to the film to be treated K also becomes about 25 nm. In this event, the oxide film on the upper surface of the resist film 600 and the upper surface of the film to be treated K are also etched simultaneously. Thereafter, the resist film 600 is removed by ashing processing. Thus, as illustrated in FIG. 26 and FIG. 27, cylindrical patterns having an inner diameter of 25 nm and an outer diameter of 45 nm are formed of the oxide film 610 having a film thickness of 10 nm.

Then, a block copolymer is applied onto the wafer W and phase-separated into hydrophilic polymers 602 and hydrophobic polymers 603. In this event, the ratio of the molecular weight of the hydrophilic polymer 602 is approximately 20% to 40% and the ratio of the molecular weight of the hydrophobic polymer 603 is approximately 80% to 60%. Thus, the columnar hydrophilic polymer 602 is phase-separated at a position equally spaced from the cylindrical oxide films 610 using the cylindrical oxide films 610 as guides. In the case of an example illustrated in FIG. 28, the columnar hydrophilic polymer 602 is arranged vertically to the upper surface of the wafer W, at a position of the intersection of diagonal lines of a square formed by four cylindrical oxide films 610. The diameter of the hydrophilic polymer 602 in this event is approximately 25 nm similar to the inner diameter of the oxide film 610, and molecular weights of the polymers in the block copolymer 611 are adjusted so that the diameter of the hydrophilic polymer 602 after the phase separation becomes a desired value. Note that since there is no space for the block copolymer 611 to phase-separate inside the cylindrical oxide film 610, the block copolymer 611 remains un-phase-separated.

Thereafter, the hydrophilic polymer 602 is selectively removed, whereby the hole pattern of the hydrophobic polymer 603 is formed at a position where the columnar hydrophilic polymer 602 has been formed. Then, an etching treatment is performed again using the hydrophobic polymer 603 as a mask to transfer the hole pattern of the hydrophobic polymer 603 to the film to be treated K. Since the hole pattern transferred to the film to be treated K using the mask of the hydrophobic polymer 603 is located obliquely at 45° from the hole patterns formed using the mask of the resist film 600, the hole patterns in a lattice form with a pitch between the hole patterns of about 63.6 nm that is 1/√2 times the pitch between the hole portions 601 of the resist pattern 600 are formed on the wafer W.

However, the inventors have confirmed that in the case where the oxide films 610 are used as guides for narrowing the pitch between the hole patterns as illustrated in FIG. 28, the hydrophilic polymers 602 are phase-separated with a predetermined thickness also on the surfaces of the oxide films 610 (between the oxide films 610 and the hydrophobic polymer 603) because the oxide films 610 have a hydrophilic property. Therefore, when the hydrophilic polymers 602 after the phase separation are selectively removed, gaps are formed between the oxide films 610 and the hydrophobic polymer, bringing about a problem of the gaps also being transferred to the film to be treated K in an etching treatment thereafter using the hydrophobic polymer 603 as a mask.

Hence, it is conceivable that a surface treatment is performed on the oxide films 610 as guides to thereby make the surfaces of the oxide films 610 hydrophobic, but the throughput of the treatment of the wafer W deteriorates due to an increase of treatment steps therefor. Besides, it is also conceivable to use a material having a hydrophobic property other than the oxide films 610, but a film used as the guide is required to be able to secure a selection ratio when ashing the resist film 600 and to be formed with a uniform thickness on a side surface of a fine hole pattern with a diameter of 45 nm as described above. At present, it is difficult to form such a film by CVD (Chemical Vapor Deposition) or the like, and there is no other preferable means.

The present invention has been developed in consideration of the above points, and its object is to appropriately form a predetermined pattern on a substrate in a substrate treatment using a block copolymer containing a hydrophilic polymer and a hydrophobic polymer.

Means for Solving the Problems

To achieve the above object, the present invention is a substrate treatment method of treating a substrate using a block copolymer containing a hydrophilic polymer and a hydrophobic polymer, the substrate treatment method including: a resist pattern formation step of forming a plurality of circular patterns of a resist film on the substrate; a first block copolymer coating step of applying a first block copolymer to the substrate after the formation of the circular patterns of the resist film; a first polymer separation step of phase-separating the first block copolymer into the hydrophilic polymer and the hydrophobic polymer; a first polymer removal step of selectively removing the hydrophilic polymer from the phase-separated first block copolymer; a resist removal step of selectively removing the resist film from a top of the substrate; a second block copolymer coating step of applying a second block copolymer to the substrate after the removal of the resist; a second polymer separation step of phase-separating the second block copolymer into the hydrophilic polymer and the hydrophobic polymer; and a second polymer removal step of selectively removing the hydrophilic polymer from the phase-separated second block copolymer, wherein a ratio of a molecular weight of the hydrophilic polymer in the first block copolymer and the second block copolymer is 20% to 40%. Note that the molecular weights of the first block copolymer and the second block copolymer and the ratios of molecular weights of the hydrophilic polymer and the hydrophobic polymer may be the same or may be different.

According to the present invention, the block copolymer having a ratio of the molecular weight of the hydrophilic polymer of 20% to 40% is applied to the substrate after the hole patterns are formed of the resist film, so that cylindrical hydrophobic polymers are formed in the hole patterns of the resist film by the subsequent first polymer separation step and first polymer removal step thereafter. Then, by selectively removing the resist film in the resist removal step, only the cylindrical hydrophobic polymers remain on the substrate. Then, the block copolymer is applied again to the substrate after the removal of the resist, and the second polymer separation step is performed, whereby the hydrophilic polymer phase-separates at a position equally spaced from the hydrophobic polymers using the hydrophobic polymers as guides. Since the hydrophobic polymers are used as guides in this event, the hydrophilic polymers do not phase-separate on the surfaces of the guides unlike the case of using the oxide film being hydrophilic as described above. Thus, it is possible to prevent gaps from being formed between the guides and the hydrophobic polymers as in the case of using the oxide films as guides, and prevent unnecessary patterns of the gaps from being transferred onto the substrate, for example, in a subsequent etching treatment. As a result, predetermined patterns are appropriately formed on the substrate.

The present invention in another aspect is a computer-readable storage medium storing a program running on a computer of a control unit controlling a substrate treatment system to cause the substrate treatment system to perform the substrate treatment method.

The present invention in still another aspect is a substrate treatment system of treating a substrate using a block copolymer containing a hydrophilic polymer and a hydrophobic polymer, the substrate treatment system including: a developing apparatus that develops a resist film after exposure processing formed on the substrate to form a resist pattern; a block copolymer coating apparatus that applies a first block copolymer and a second block copolymer to the substrate after the formation of the resist pattern; a polymer separation apparatus that phase-separates the first block copolymer and the second block copolymer into the hydrophilic polymer and the hydrophobic polymer; a polymer removing apparatus that selectively removes the hydrophilic polymer from the phase-separated first block copolymer and second block copolymer; a resist removing apparatus that selectively removes the resist film from a top of the substrate; and a control unit that controls the block copolymer coating apparatus, the polymer separation apparatus, the polymer removing apparatus, and the resist removing apparatus.

The control unit is configured to control: the block copolymer coating apparatus to apply the first block copolymer to the substrate after a circular pattern is formed; the polymer separation apparatus to phase-separate the first block copolymer into the hydrophilic polymer and the hydrophobic polymer; the polymer removing apparatus to selectively remove the hydrophilic polymer after the phase-separation; the resist removing apparatus to selectively remove the resist film from the top of the substrate; the block copolymer coating apparatus to apply the second block copolymer to the substrate after the removal of the resist; the polymer separation apparatus to phase-separate the second block copolymer into the hydrophilic polymer and the hydrophobic polymer; and the polymer removing apparatus to selectively remove the hydrophilic polymer from the phase-separated second block copolymer, wherein a ratio of a molecular weight of the hydrophilic polymer in the first block copolymer and the second block copolymer is 20% to 40%.

Effect of the Invention

According to the present invention, a predetermined pattern can be appropriately formed on a substrate in a substrate treatment using a block copolymer containing a hydrophilic polymer and a hydrophobic polymer.

BEST MODE FOR CARRYING OUT THE INVENTION

Figure 1:
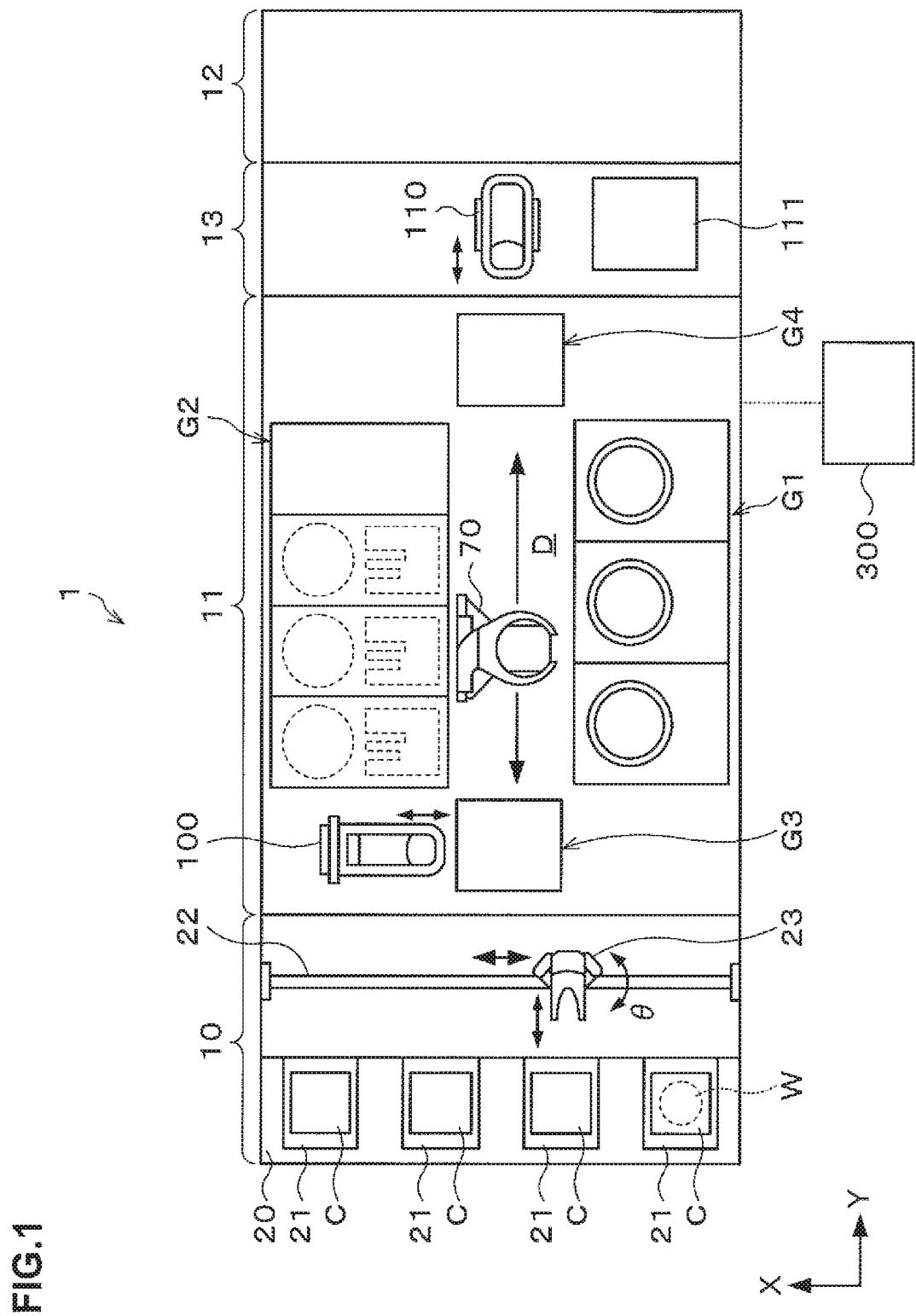
FIG. 1 A plan view illustrating the outline of a configuration of a substrate treatment system according to this embodiment.
Figure 2:
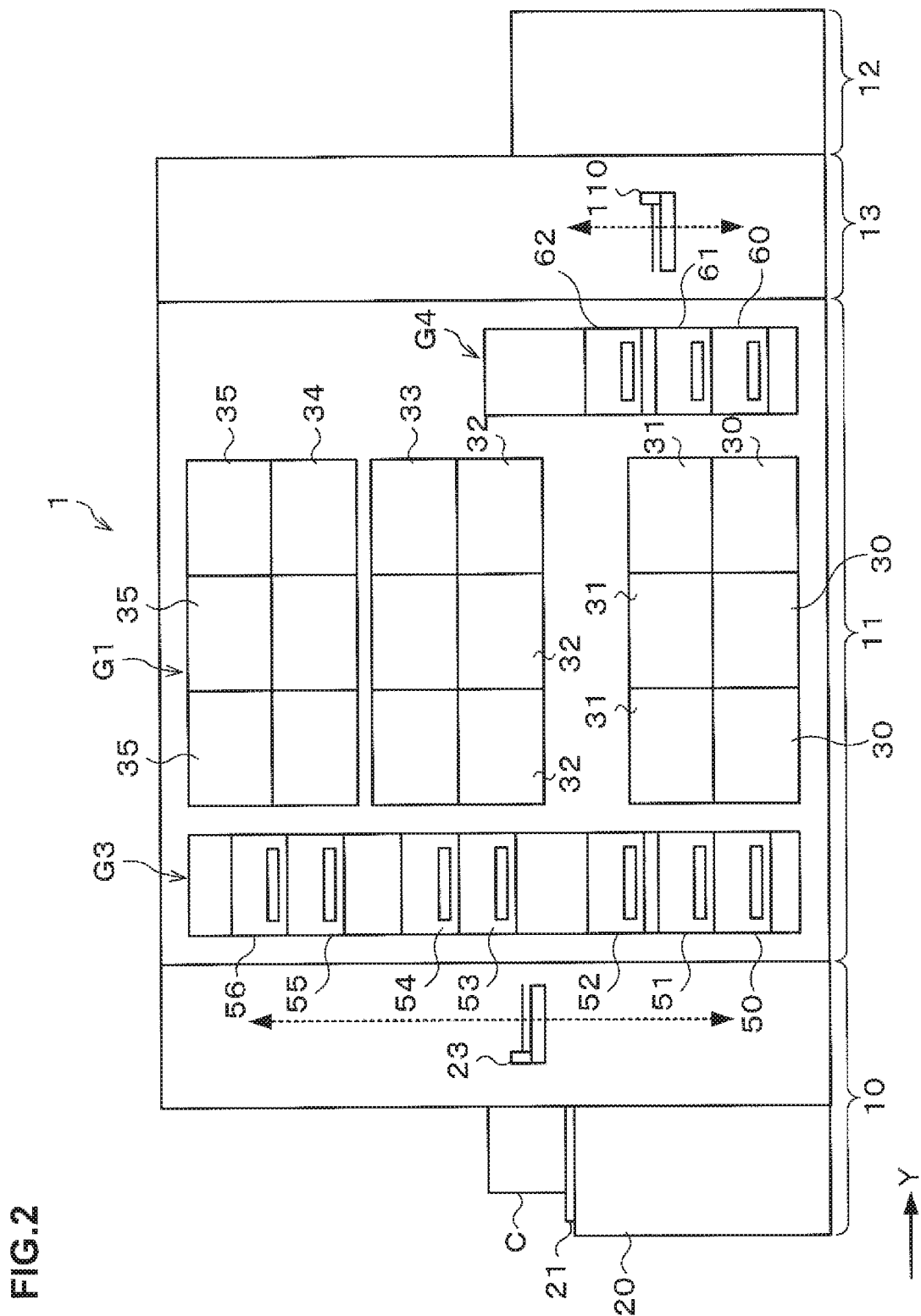
FIG. 2 A side view illustrating the outline of the configuration of the substrate treatment system according to this embodiment.
Figure 3:
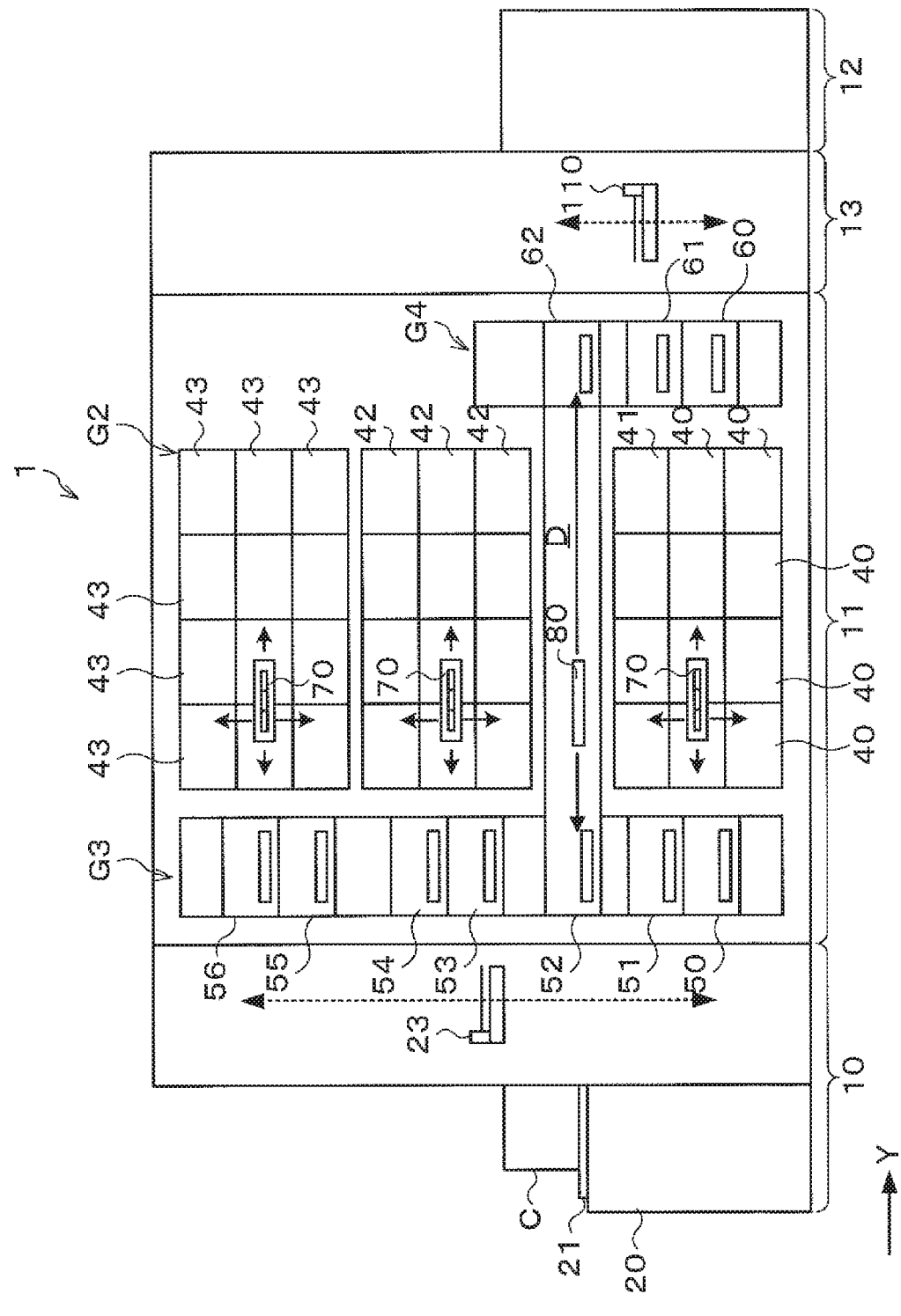
FIG. 3 A side view illustrating the outline of the configuration of the substrate treatment system according to this embodiment.

Hereinafter, an embodiment of the present invention will be described. FIG. 1 is an explanatory view illustrating the outline of a configuration of a substrate treatment system 1 that performs a substrate treatment method according to this embodiment. FIG. 2 and FIG. 3 are side views illustrating the outline of an internal configuration of the substrate treatment system 1. The substrate treatment system 1 in this embodiment is, for example, a coating and developing treatment system, and will be described using a case of forming a predetermined pattern in a film to be treated formed on an upper surface of the wafer W in this embodiment.

The substrate treatment system 1 has, as illustrated in FIG. 1, a configuration in which a cassette station 10 into/out of which a cassette C housing a plurality of wafers W is carried, a treatment station 11 including a plurality of various treatment apparatuses which perform predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are carried in/out from/to the outside of the substrate treatment system 1.

In the cassette station 10, a wafer carrier apparatus 23 is provided which is movable on a carrier path 22 extending in the X-direction as illustrated in FIG. 1. The wafer carrier apparatus 23 is movable also in a vertical direction and around a vertical axis (in a θ-direction), and can carry the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, developing apparatuses 30 each of which performs a developing treatment on the wafer W, organic solvent supply apparatuses 31 as polymer removing apparatuses each of which supplies an organic solvent onto the wafer W, anti-reflection film forming apparatuses 32 each of which forms an anti-reflection film on the wafer W, neutral layer forming apparatuses 33 each of which applies a neutralizing agent onto the wafer W to form a neutral layer, resist coating apparatuses 34 each of which applies a resist solution onto the wafer W to form a resist film, and block copolymer coating apparatuses 35 each of which applies a block copolymer onto the wafer W, are stacked in order from the bottom.

For example, three pieces of each of the developing apparatus 30, the organic solvent supply apparatus 31, the anti-reflection film forming apparatus 32, the neutral layer forming apparatus 33, the resist coating apparatus 34, and the block copolymer coating apparatus 35 are arranged side by side in the horizontal direction. Note that the numbers and the arrangement of the developing apparatuses 30, the organic solvent supply apparatuses 31, the anti-reflection film forming apparatuses 32, the neutral layer forming apparatuses 33, the resist coating apparatuses 34, and the block copolymer coating apparatuses 35 can be arbitrarily selected.

In the developing apparatus 30, the organic solvent supply apparatus 31, the anti-reflection film forming apparatus 32, the neutral layer forming apparatus 33, the resist coating apparatus 34, and the block copolymer coating apparatus 35, for example, spin coating of applying a predetermined coating solution onto the wafer W is performed. In the spin coating, the coating solution is discharged, for example, from a coating nozzle onto the wafer W and the wafer W is rotated to diffuse the coating solution over the front surface of the wafer W. The configurations of these solution treatment apparatuses will be described later.

Note that the block copolymer to be applied onto the wafer W in the block copolymer coating apparatus 35 is a macromolecule (copolymer) having a first polymer (a polymer of a first monomer) and a second polymer (a polymer of a second monomer) in which the first monomer and the second monomer are polymerized into a linear chain. As the first polymer, a hydrophilic polymer having a hydrophilic property (polarity) is used, and as the second polymer, a hydrophobic polymer having a hydrophobic property (no polarity) is used. In this embodiment, for example, polymethyl methacrylate (PMMA) is used as the hydrophilic polymer and, for example, polystyrene (PS) is used as the hydrophobic polymer. Further, the ratio of a molecular weight of the hydrophilic polymer in the block copolymer is about 20% to 40%, and the ratio of a molecular weight of the hydrophobic polymer in the block copolymer is about 80% to 60%. Besides, the block copolymer is obtained by making the copolymer of the hydrophilic polymer and the hydrophobic polymer into a solution by using a solvent.

Further, the neutral layer formed on the wafer W in the neutral layer forming apparatus 33 has an intermediate affinity to the hydrophilic polymer and the hydrophobic polymer. In this embodiment, for example, a random copolymer or an alternating copolymer of polymethyl methacrylate and polystyrene is used as the neutral layer. Hereinafter, "neutral" means the case having the intermediate affinity to the hydrophilic polymer and the hydrophobic polymer as described above.

For example, in the second block G2, as illustrated in FIG. 3, thermal treatment apparatuses 40 each of which performs a thermal treatment on the wafer W, ultraviolet irradiation apparatuses 41 as modification treatment apparatuses each of which irradiates the block copolymer on the wafer W with an ultraviolet ray as an energy ray to perform a modification treatment on the block copolymer, adhesion apparatuses 42 each of which performs a hydrophobic treatment on the wafer W, edge exposure apparatuses 43 each of which exposes the outer peripheral portion of the wafer W, and polymer separation apparatuses 44 each of which phase-separates the block copolymer applied on the wafer W in the block copolymer coating apparatus 35 into the hydrophilic polymer and the hydrophobic polymer, are arranged side by side in the vertical direction and in the horizontal direction. The thermal treatment apparatus 40 has a hot plate which mounts and heats the wafer W thereon and a cooling plate which mounts and cools the wafer W thereon, and thereby can perform both of a heat treatment and a cooling treatment. Note that the polymer separation apparatus 44 is also an apparatus that performs a thermal treatment on the wafer W, and its configuration is the same as that of the thermal treatment apparatus 40. The ultraviolet irradiation apparatus 41 has a mounting table on which the wafer W is to be mounted and an ultraviolet irradiation unit which irradiates the wafer W on the mounting table with an ultraviolet ray having a wavelength of, for example, 172 nm. The numbers and the arrangement of the thermal treatment apparatuses 40, the ultraviolet irradiation apparatuses 41, the adhesion apparatuses 42, the edge exposure apparatuses 43, and the polymer separation apparatuses 44 can be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer carry region D is formed in a region surrounded by the first block G1 to the fourth block G4 as illustrated in FIG. 1. In the wafer carry region D, for example, a plurality of wafer carrier apparatuses 70 are arranged each of which has a carrier arm that is movable, for example, in the Y-direction, the X-direction, the θ-direction, and the vertical direction. The wafer carrier apparatus 70 can move in the wafer carry region D to carry the wafer W to a predetermined apparatus in the first block G1, the second block G2, the third block G3 and the fourth block G4 therearound.

Further, in the wafer carry region D, a shuttle carrier apparatus 80 is provided which linearly carries the wafer W between the third block G3 and the fourth block G4.

The shuttle carrier apparatus 80 is configured to be linearly movable, for example, in the Y-direction. The shuttle carrier apparatus 80 can move in the Y-direction while supporting the wafer W, and carry the wafer W between the delivery apparatus 52 in the third block G3 and the delivery apparatus 62 in the fourth block G4.

As illustrated in FIG. 1, a wafer carrier apparatus 100 is provided adjacent on the X-direction positive direction side of the third block G3. The wafer carrier apparatus 100 has a carrier arm that is movable, for example, in the X-direction, the θ-direction, and the vertical direction. The wafer carrier apparatus 100 can move up and down while supporting the wafer W to carry the wafer W to each of the delivery apparatuses in the third block G3.

In the interface station 13, a wafer carrier apparatus 110 and a delivery apparatus 111 are provided. The wafer carrier apparatus 110 has a carrier arm that is movable, for example, in the Y-direction, the θ-direction, and the vertical direction. The wafer carrier apparatus 110 can carry the wafer W to/from each of the delivery apparatuses in the fourth block G4, the delivery apparatus 111 and the exposure apparatus 12, for example, while supporting the wafer W by the carrier arm.

Figure 4:
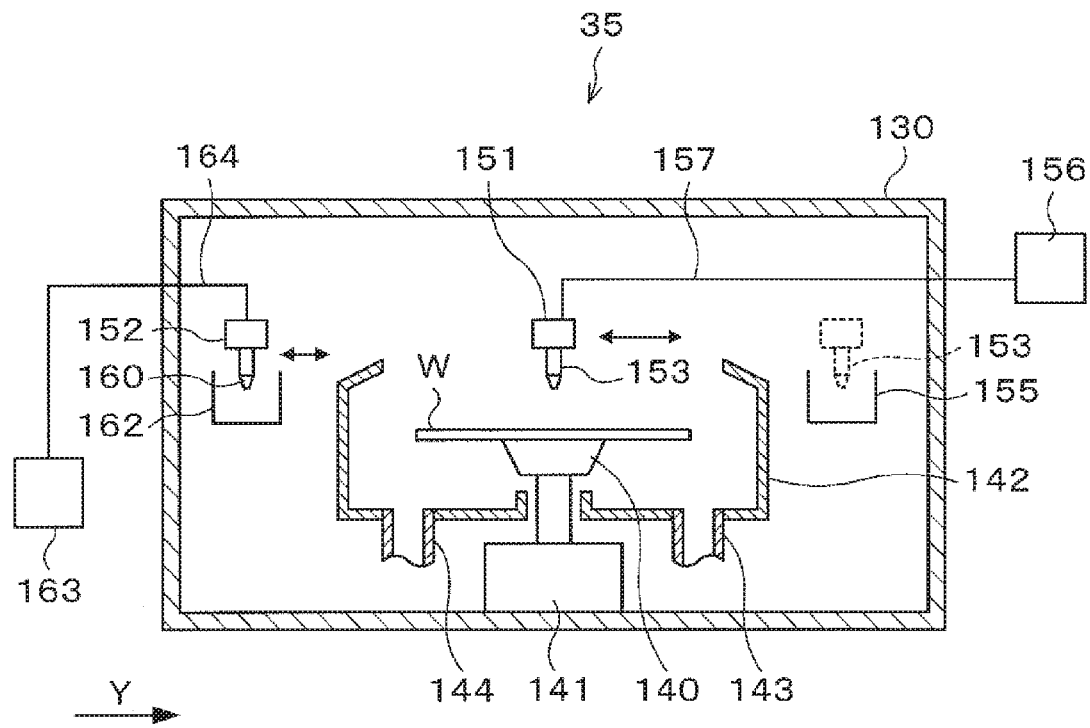
FIG. 4 A longitudinal sectional view illustrating the outline of a configuration of a block copolymer coating apparatus.

Next, the configuration of the aforementioned block copolymer coating apparatus 35 will be described. The block copolymer coating apparatus 35 has a treatment container 130 as illustrated in FIG. 4. In a side surface of the treatment container 130, a carry-in/out port (not illustrated) for the wafer W is formed.

In the treatment container 130, a spin chuck 140 is provided which holds and rotates the wafer W thereon. The spin chuck 140 can rotate at a predetermined speed by means of a chuck drive unit 141 such as a motor.

Around the spin chuck 140, a cup 142 is provided which receives and collects liquid splashing or dropping from the wafer W. A drain pipe 143 that drains the collected liquid and an exhaust pipe 144 that exhausts the atmosphere in the cup 142 are connected to the lower surface of the cup 142.

Figure 5:
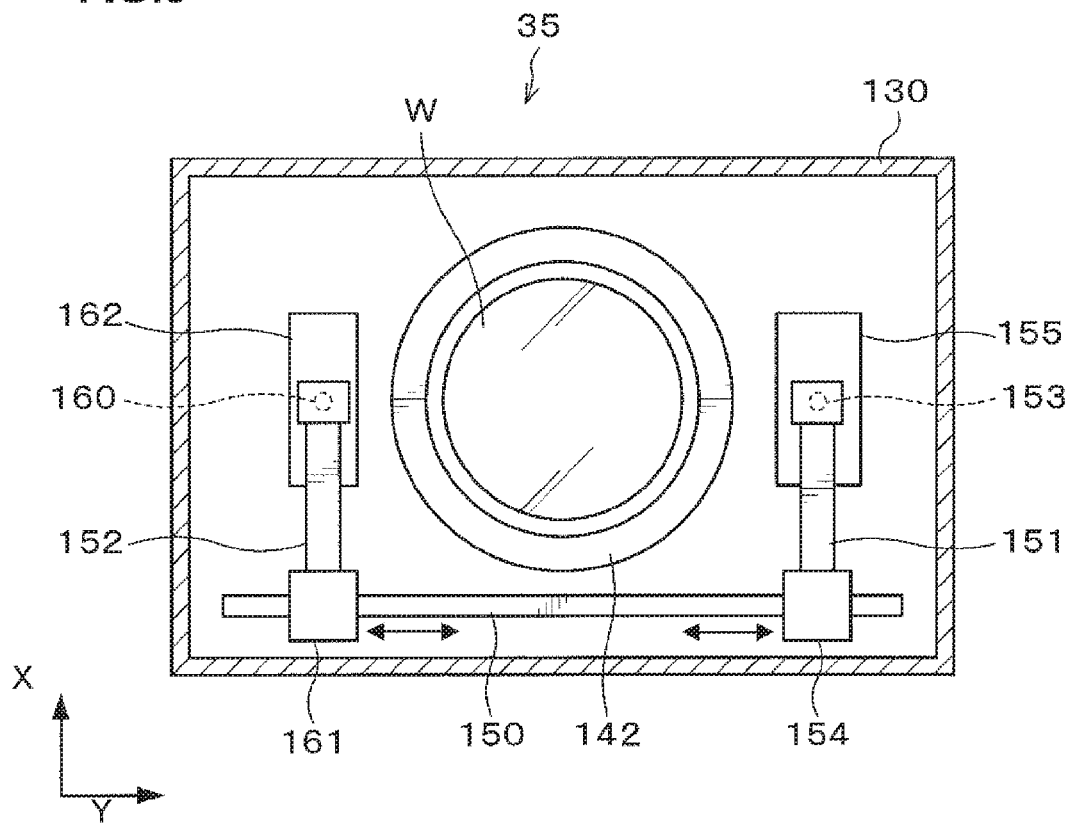
FIG. 5 A transverse sectional view illustrating the outline of the configuration of the block copolymer coating apparatus.

As illustrated in FIG. 5, on an X-direction negative direction (lower direction in FIG. 5) side of the cup 142, a rail 150 extending along a Y-direction (right-left direction in FIG. 5) is formed. The rail 150 is formed, for example, from a Y-direction negative direction (left direction in FIG. 5) side outer position of the cup 142 to a Y-direction positive direction (right direction in FIG. 5) side outer position. To the rail 150, for example, two arms 151, 152 are attached.

On the first arm 151, a first supply nozzle 153 is supported which supplies a first block copolymer. The first arm 151 is movable on the rail 150 by means of a nozzle drive unit 154 illustrated in FIG. 5. Thus, the first supply nozzle 153 can move from a waiting section 155 provided at a Y-direction positive direction side outer position of the cup 142 to a position above a central portion of the wafer W in the cup 142, and further move in a diameter direction of the wafer W above the front surface of the wafer W. Further, the first arm 151 can freely rise and lower by means of the nozzle drive unit 154 and thereby adjust the height of the first supply nozzle 153.

To the first supply nozzle 153, a first block copolymer supply pipe 157 is connected which communicates with a first block copolymer supply source 156 as illustrated in FIG. 4.

On the second arm 152, a second supply nozzle 160 is supported which supplies a second block copolymer. The second arm 152 is movable on the rail 150 by means of a nozzle drive unit 161 illustrated in FIG. 5, and can move the second supply nozzle 160 from a waiting section 162 provided at a Y-direction negative direction side outer position of the cup 142 to a position above a central portion of the wafer W in the cup 142. Further, the second arm 152 can freely rise and lower by means of the nozzle drive unit 161 and thereby adjust the height of the second supply nozzle 160.

To the second supply nozzle 160, a second block copolymer supply pipe 164 is connected which communicates with a second block copolymer supply source 163 as illustrated in FIG. 4. Note that the first block copolymer and the second block copolymer will be described later.

The configurations of the developing apparatus 30, the organic solvent supply apparatus 31, the anti-reflection film forming apparatus 32, the neutral layer forming apparatus 33, and the resist coating apparatus 34 which are the other solution treatment apparatuses are the same as that of the above-described block copolymer coating apparatus 35 except that the solution to be supplied from the nozzle is different, and therefore description thereof is omitted.

In the above substrate treatment system 1, a control unit 300 is provided as illustrated in FIG. 1. The control unit 300 is, for example, a computer and has a program storage unit (not illustrated). In the program storage unit, a program that controls the treatments on the wafer W in the substrate treatment system 1 is stored. Further, the program storage unit also stores a program that controls the operations of the above-described various treatment apparatuses and a driving system such as the carrier apparatuses to realize a later-described treatment in the substrate treatment system 1. Note that the programs may be the ones which are recorded, for example, in a computer-readable storage medium such as a computer-readable hard disk (HD), flexible disk (FD), compact disk (CD), magneto-optical disk (MO), or memory card, and installed from the storage medium into the control unit 300.

Figure 6:
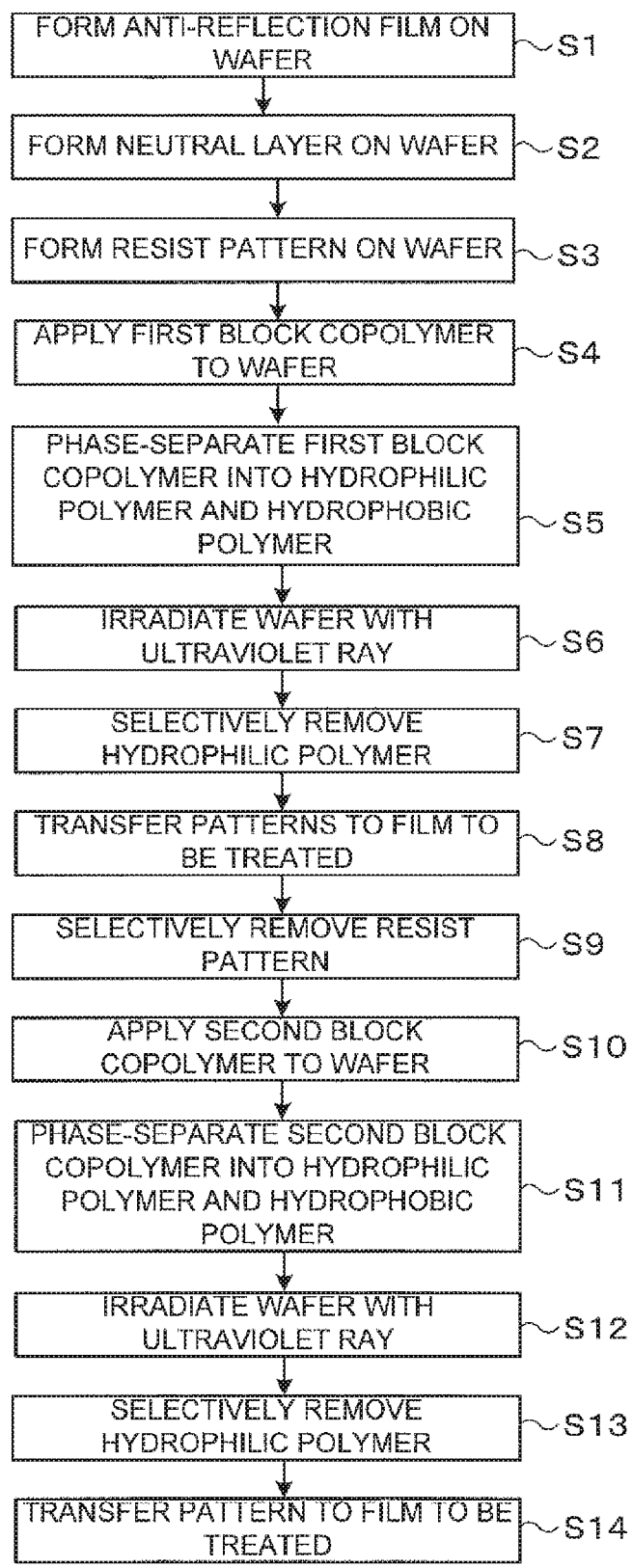
FIG. 6 A flowchart illustrating main steps of a wafer treatment.

Next, a wafer treatment performed using the substrate treatment system 1 configured as described above will be described. FIG. 6 is a flowchart illustrating examples of main steps of the wafer treatment.

First, the cassette C housing a plurality of wafers W is carried into the cassette station 10 of the substrate treatment system 1 and the wafers W in the cassette C are successively carried by the wafer carrier apparatus 23 to the delivery apparatus 53 in the treatment station 11.

Figure 7:
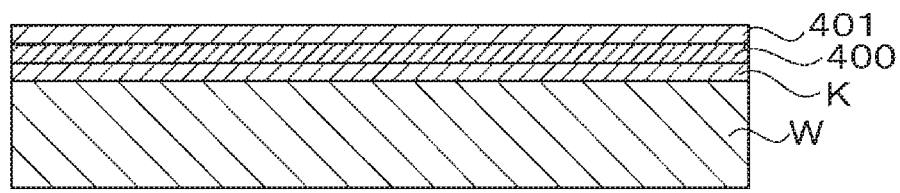
FIG. 7 An explanatory view of a longitudinal cross-section illustrating an appearance in which an anti-reflection film and a neutral layer are formed on a wafer.

The wafer W is then carried to the thermal treatment apparatus 40 and temperature-regulated, and then carried to the anti-reflection film forming apparatus 32, in which an anti-reflection film 400 is formed on the wafer W as illustrated in FIG. 7 (Step S1 in FIG. 6). Note that on the wafer W in this embodiment, the film to be treated K has been formed in advance on the upper surface of the wafer W as has been described, and the anti-reflection film 400 is formed on the upper surface of the film to be treated K. The wafer W is then carried to the thermal treatment apparatus 40 and heated and temperature-regulated.

The wafer W is then carried to the neutral layer forming apparatus 33, in which the neutralizing agent is applied onto the anti-reflection film 400 on the wafer W as illustrated in FIG. 7 to form a neutral layer 401 (Step S2 in FIG. 6). Thereafter, the wafer W is carried to the thermal treatment apparatus 40 and heated and temperature-regulated.

The wafer W is then carried to the adhesion unit 42 and subjected to an adhesion treatment. The wafer W is then carried to the resist coating apparatus 34, in which the resist solution is applied onto the neutral layer 401 of the wafer W to form a resist film. Thereafter, the wafer W is carried to the thermal treatment apparatus 40 and subjected to a pre-baking treatment. The wafer W is then carried to the edge exposure apparatus 43 and subjected to edge exposure processing. Note that the resist in this embodiment is, for example, an ArF resist.

Figure 8:
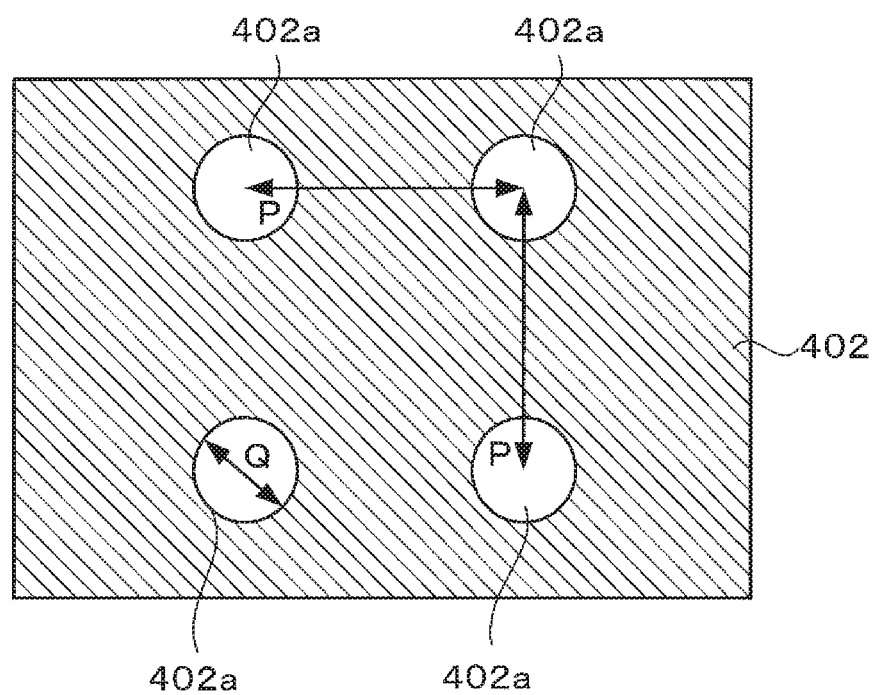
FIG. 8 An explanatory view of a plan view illustrating an appearance in which a resist pattern is formed on the neutral layer.
Figure 9:
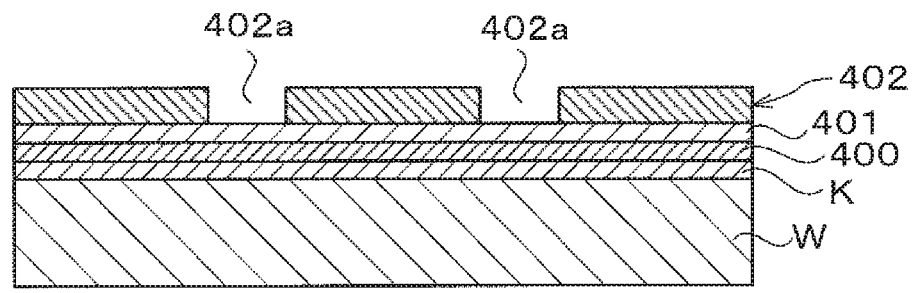
FIG. 9 An explanatory view of a longitudinal cross-section illustrating the appearance in which the resist pattern is formed on the neutral layer.

Thereafter, the wafer W is carried by the wafer carrier apparatus 110 in the interface station 13 to the exposure apparatus 12 and subjected to exposure processing. The wafer W is then carried to the thermal treatment apparatus 40 and subjected to a post-exposure baking treatment. The wafer W is thereafter carried to the developing apparatus 30 and developed. After the development ends, the wafer W is carried to the thermal treatment apparatus 40 and subjected to a post-baking treatment. Thus, a predetermined resist pattern 402 of the resist film is formed on the neutral layer 401 of the wafer W as illustrated in FIG. 8, FIG. 9 (Step S3 in FIG. 6). In this embodiment, the resist pattern 402 is a pattern in which circular hole portions 402a each having a diameter Q are arranged in a lattice form in a plan view. Further, the distances (pitches P in FIG. 8) between centers of the vertically and horizontally adjacent hole portions 402a are the same. More specifically, the hole portions 402a are provided in a square form. The pitch P in this embodiment is, for example, about 90 nm. Note that the diameter Q of the hole portion 402a is set such that the hydrophilic polymer and the hydrophobic polymer are phase-separated to be concentric with the hole portion 402a as described later. In this embodiment, the diameter Q of the hole portion 402a is, for example, about 45 nm.

Figure 10:
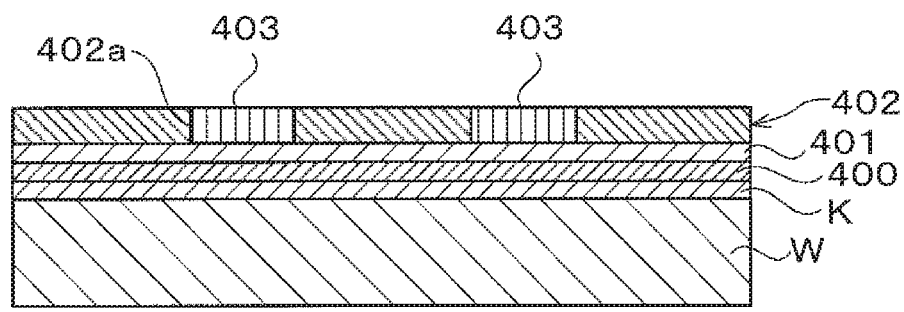
FIG. 10 An explanatory view of a longitudinal cross-section illustrating an appearance in which a first block copolymer is applied on the wafer.

The wafer W is then carried to the block copolymer coating apparatus 35. In the block copolymer coating apparatus 35, a first block copolymer 403 is supplied from the first supply nozzle 153 onto the wafer W and thereby the first block copolymer 403 is applied onto the wafer W as illustrated in FIG. 10 (first block copolymer coating step, Step S4 in FIG. 6).

Figure 11:
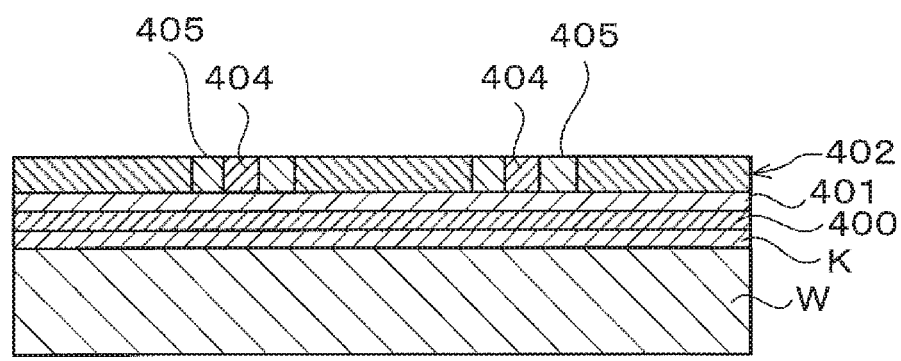
FIG. 11 An explanatory view of a longitudinal cross-section illustrating an appearance in which the first block copolymer is phase-separated into hydrophilic polymers and hydrophobic polymers.
Figure 12:
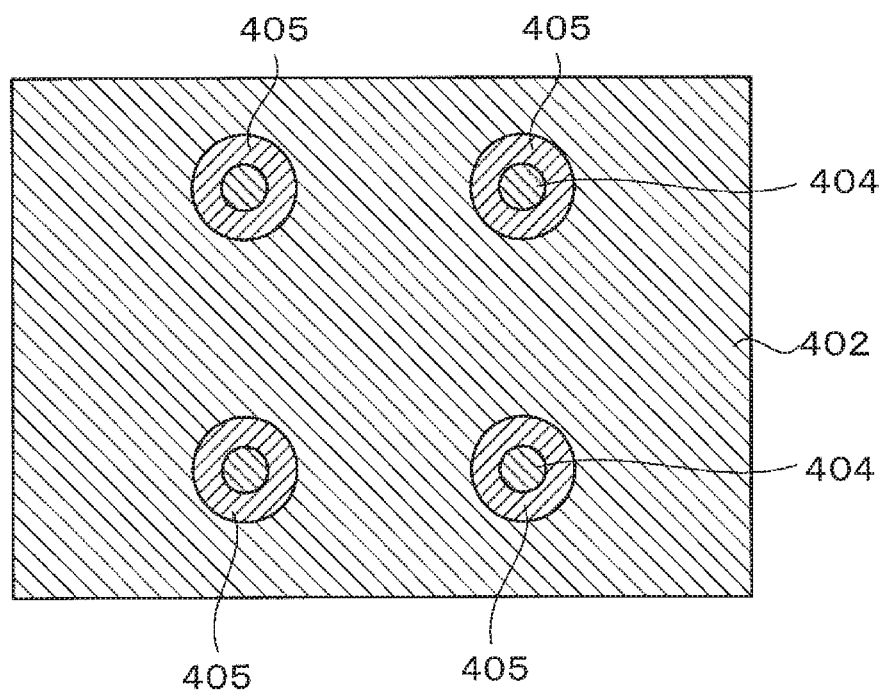
FIG. 12 An explanatory view of a plane illustrating an appearance in which the first block copolymer is phase-separated into the hydrophilic polymers and the hydrophobic polymers.

The wafer W is then carried to the polymer separation apparatus 44 and subjected to a thermal treatment at a predetermined temperature. This phase-separates the first block copolymer 403 on the wafer W into a hydrophilic polymer 404 and a hydrophobic polymer 405 (first polymer separation step, Step S5 in FIG. 6). Here, as described above, the ratio of a molecular weight of the hydrophilic polymer 404 is 20% to 40%, and the ratio of a molecular weight of the hydrophobic polymer 405 is 80% to 60% in the first block copolymer 403. Then, in Step S5, as illustrated in FIG. 11 and FIG. 12, the columnar hydrophilic polymer 404 is phase-separated at the center of each of the hole portions 402a of the resist pattern 402. Further, the cylindrical hydrophobic polymer 405 is phase-separated to be concentric with the hydrophilic polymer 404 in a manner to surround the outer periphery of the hydrophilic polymer 404. Note that the diameter of the columnar hydrophilic polymer 404 is decided by a $\chi$ (chi) parameter being an interaction parameter between the hydrophilic polymer and the hydrophobic polymer which are macromolecules constituting the first block copolymer 403 and by molecular weights of the polymers. Therefore, the first block copolymer 403 has a $\chi$ (chi) parameter and molecular weights of the polymers set so that the diameter of the columnar hydrophilic polymer 404, namely, the hole pattern to be transferred to the film to be treated K in a later-described etching treatment step becomes a desired diameter. In this embodiment, the diameter of the columnar hydrophilic polymer 404 after phase separation is, for example, about 25 nm.

The wafer W is then carried to the ultraviolet irradiation apparatus 41. In the ultraviolet irradiation apparatus 41, irradiation of the wafer W with the ultraviolet ray cuts the bonding chain of polymethyl methacrylate being the hydrophilic polymer 404 and causes a cross-linking reaction of polystyrene being the hydrophobic polymer 405 (Step S6 in FIG. 6).

Figure 13:
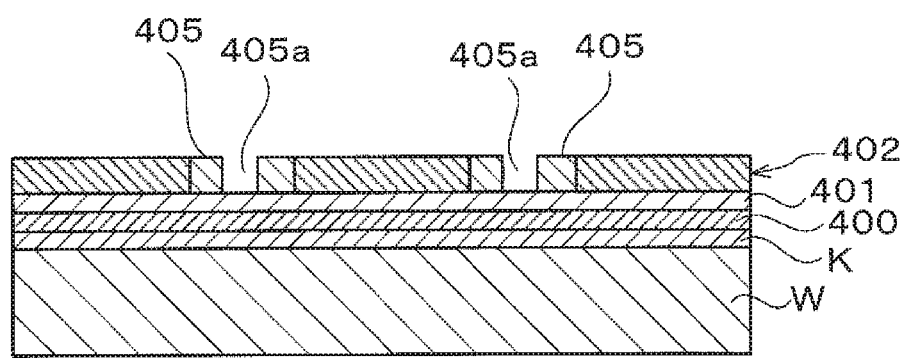
FIG. 13 An explanatory view of a longitudinal cross-section illustrating an appearance in which the hydrophilic polymers are selectively removed from the block copolymers after the phase separation.

The wafer W is then carried to the organic solvent supply apparatus 31. In the organic solvent supply apparatus 31, an organic solvent having a polarity is supplied to the wafer W. As the polar organic solvent, for example, IPA (isopropyl alcohol) or the like is used. Thus, the hydrophilic polymer 404 whose bonding chain has been cut by the irradiation with the ultraviolet ray is dissolved with the organic solvent, and the hydrophilic polymer 404 is selectively removed from the wafer W (first polymer removal step, Step S7 in FIG. 6). As a result, hole-shaped patterns 405*a* each having an inner diameter of 25 nm are formed of the hydrophobic polymers 405 as illustrated in FIG. 13. Note that the Step S7 is also a so-called hole shrink process of decreasing the diameter of the hole portion 402*a*.

Thereafter, the wafer W is carried by the wafer carrier apparatus 70 to the delivery apparatus 50, and then carried by the wafer carrier apparatus 23 in the cassette station 10 to the cassette C on the predetermined mounting plate 21.

Figure 14:
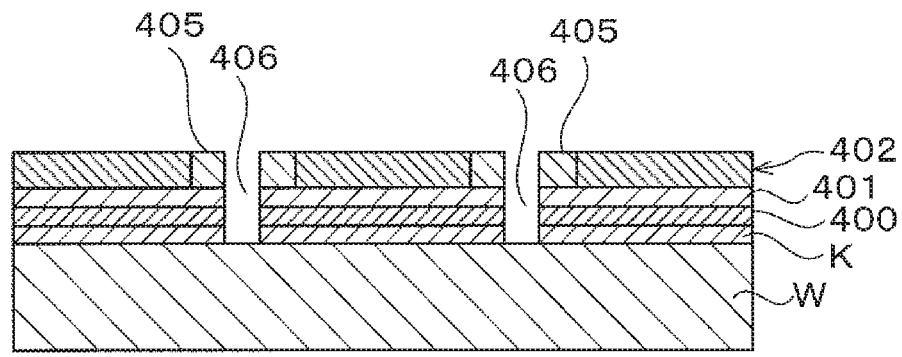
FIG. 14 An explanatory view of a longitudinal cross-section illustrating an appearance in which a film to be treated is subjected to an etching treatment.

Thereafter, the cassette C is carried to an etching treatment apparatus (not illustrated) provided outside the substrate treatment system 1, and the neutral layer 401, the anti-reflection film 400, and the film to be treated K are subjected to an etching treatment using, for example, the resist film (resist pattern 402) and the hydrophobic polymers 405 as a mask. Thus, hole patterns 406 each having a diameter of 25 nm are transferred as predetermined patterns to the film to be treated K as illustrated in FIG. 14 (Step S8 in FIG. 6). Note that as the etching treatment apparatus, for example, an RIE (Reactive Ion Etching) apparatus is used. More specifically, in the etching treatment apparatus, dry etching is performed which etches films to be treated such as the hydrophilic polymer and the anti-reflection film using reactive gas (etching gas), ions, or radicals.

Figure 15:
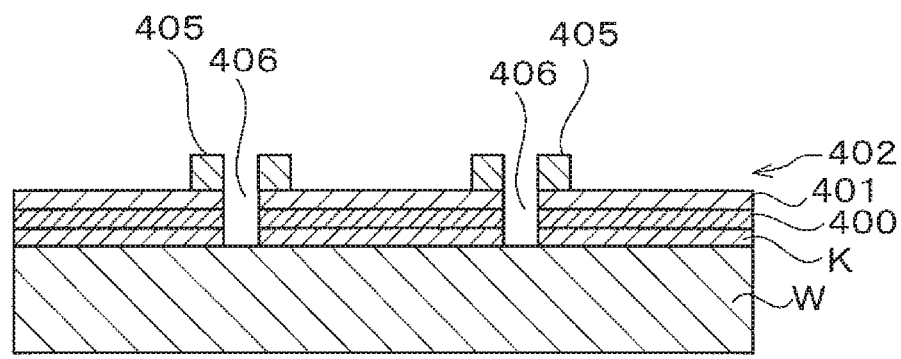
FIG. 15 An explanatory view of a longitudinal cross-section illustrating an appearance in which the resist pattern is removed after the etching treatment of the film to be treated.
Figure 16:
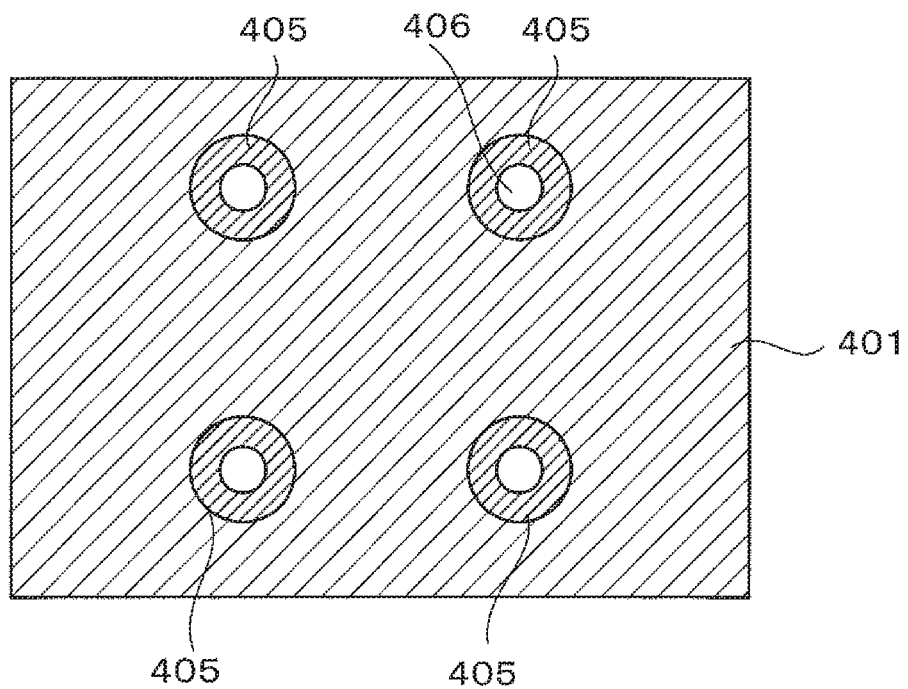
FIG. 16 An explanatory view of a plane illustrating an appearance in which the resist pattern is removed after the etching treatment of the film to be treated.

The wafer W is then carried to an ashing processing apparatus (not illustrated) being the resist removing apparatus, in which the resist pattern 402 is selectively removed from the top of the wafer W (Step S9 in FIG. 6). As a result, cylindrical bodies composed of the hydrophobic polymers 405 having columnar hole patterns (holes) 406 therein arrayed in a pattern of a square are formed on the upper surface of the neutral layer 401 of the wafer W as illustrated, for example, in FIG. 15, FIG. 16. In other words, a state in which only the cylindrical hydrophobic polymers 405 remain on the upper surface of the neutral layer 401 of the wafer W is created. Note that in this ashing processing, the hydrophobic polymers 405 remaining in the hole portions 402*a* of the resist pattern 402 are also subjected to ashing, but the ArF resist generally uses polymethyl methacrylate as a base material. According to the present inventors, a selection ratio with respect to polystyrene being the hydrophobic polymers 405 can be secured, so that the hydrophobic polymers 405 are not completely subjected to ashing but remain on the wafer W.

Figure 17:
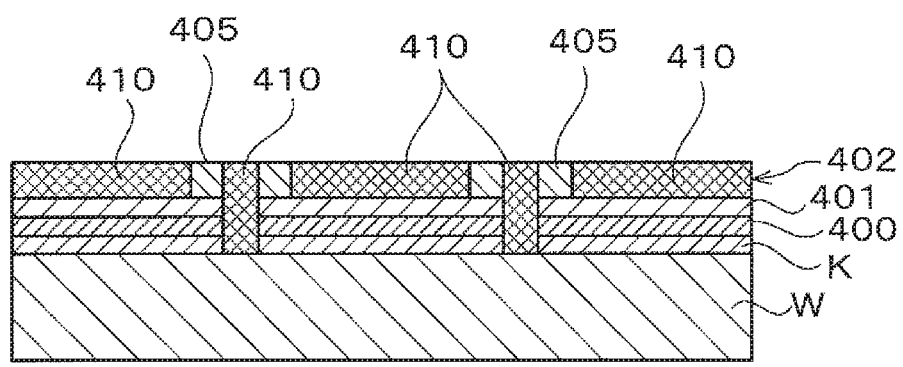
FIG. 17 An explanatory view of a longitudinal cross-section illustrating an appearance in which a second block copolymer is applied on the wafer.

The wafer W from which the resist pattern 402 has been removed by the ashing processing is carried again to the substrate treatment system 1. The wafer W is then carried to the block copolymer coating apparatus 35, in which a second block copolymer 410 is supplied from the second supply nozzle 160 onto the wafer W in a state that only the cylindrical hydrophobic polymers 405 remain on the upper surface of the neutral layer 401, whereby the second block copolymer 410 is applied onto the wafer W as illustrated in FIG. 17 (second block copolymer coating step, Step S10 in FIG. 6). In this event, the second block copolymer 410 is also applied inside the hole patterns 406. The molecular weights of the polymers in the second block copolymer 410 are set such that when the second block copolymer 410 is phase-separated, the diameter of the columnar hydrophilic polymer becomes about 25 nm.

Figure 18:
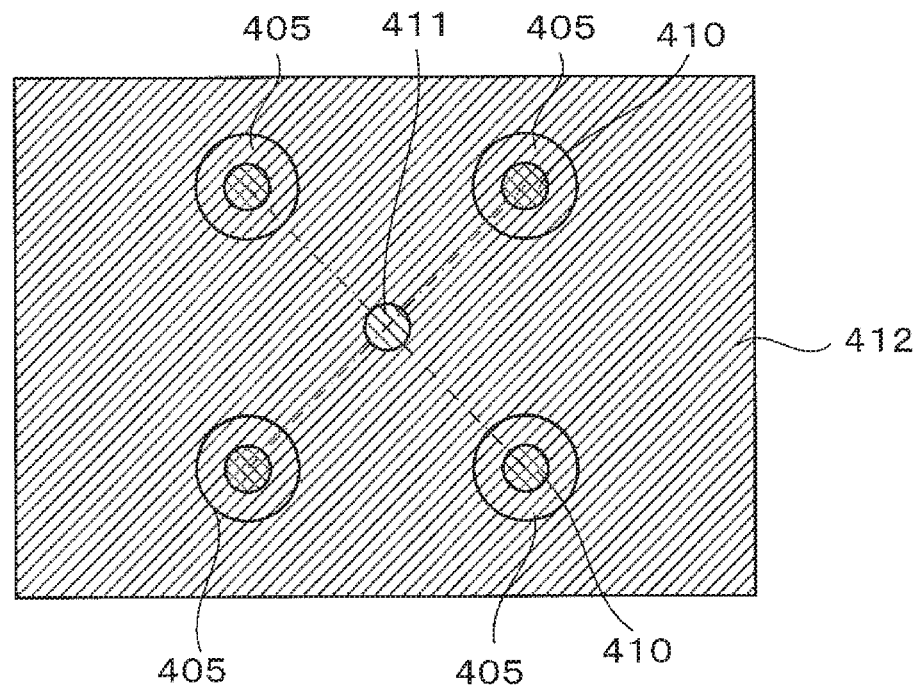
FIG. 18 An explanatory view of a plane illustrating an appearance in which the second block copolymer is phase-separated into a hydrophilic polymer and a hydrophobic polymer.
Figure 19:
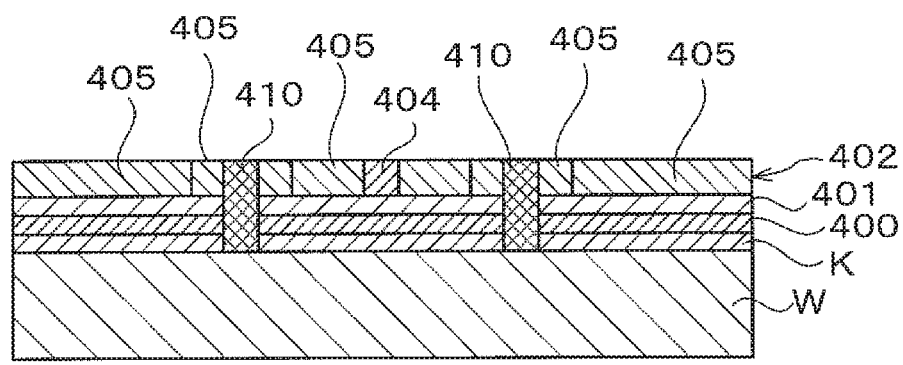
FIG. 19 An explanatory view of a longitudinal cross-section illustrating the appearance in which the second block copolymer is phase-separated into the hydrophilic polymer and the hydrophobic polymer.

The wafer W is then carried to the polymer separation apparatus 44 and subjected to a thermal treatment at a predetermined temperature as in Step S5. This phase-separates the second block copolymer 410 on the wafer W into a hydrophilic polymer 411 and a hydrophobic polymer 412 as illustrated in FIG. 18, FIG. 19 (second polymer separation step, Step S11 in FIG. 6). Note that the second block copolymer 410 applied to the inside of each of the cylindrical hydrophobic polymers 405 does not phase-separate but remains as it is as the second block copolymer 410 because there is no space for phase separation inside the cylindrical hydrophobic polymers 405.

The phase-separated hydrophilic polymer 411 is arranged at a position equally spaced from the hydrophobic polymers 405 phase-separated in the first polymer separation step (Step S5). In this embodiment, the hydrophobic polymers 405 are arrayed in a square form, and therefore the hydrophilic polymer 411 is arranged at a position of the intersection of diagonal lines (one-dotted chain lines in FIG. 18) of a square formed by the hydrophobic polymers 405, for example, as illustrated in FIG. 18, and the hydrophobic polymer 412 phase-separated in the second polymer separation step is arranged at the other portion. In this event, the cylindrical hydrophobic polymers 405 are used as guides of the hydrophilic polymers 404, and therefore the hydrophobic polymer 405 phase-separated in the second polymer separation step (Step S11) is arranged adjacent to the hydrophobic polymers 405 phase-separated in the first polymer separation step (Step S5). In other words, the hydrophilic polymer 411 is never arranged adjacent to the surfaces of the hydrophobic polymers 405 phase-separated in the first polymer separation step, unlike the case of using the hydrophilic oxide film 610 as a guide. Note that the first block copolymer 403 allows the hydrophilic polymer 404 having a diameter of about 25 nm to phase-separate inside the hole portion 402*a* having a diameter of about 45 nm, whereas the second block copolymer 410 allows the columnar hydrophilic polymer 411 having a diameter of about 25 nm to phase-separate among the hydrophobic polymers 405 as described above, so that the molecular weights of the polymers are different from those of the first block copolymer 403.

Figure 20:
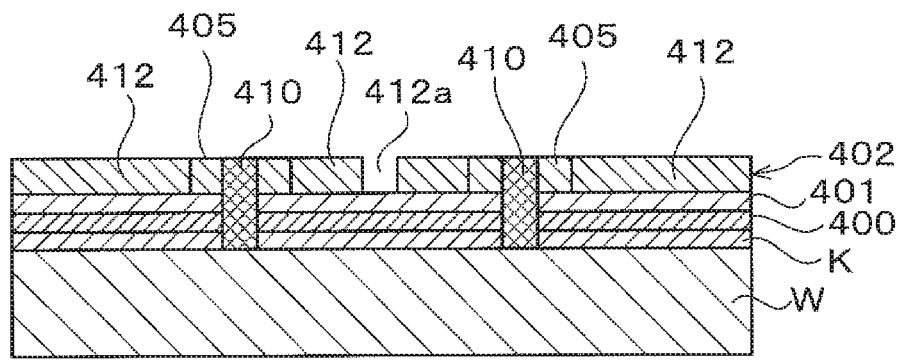
FIG. 20 An explanatory view of a longitudinal cross-section illustrating an appearance in which the hydrophilic polymer is selectively removed from the block copolymer after the phase separation.

Thereafter, as in Step S6, the wafer W is irradiated with the ultraviolet ray in the ultraviolet irradiation apparatus 41, and thereby the bonding chain of polymethyl methacrylate being the hydrophilic polymer 411 is cut and polystyrene being the hydrophobic polymer 412 is subjected to a cross-linking reaction (Step S12 in FIG. 6). The wafer W is then carried to the organic solvent supply apparatus 31, in which a polar organic solvent is supplied onto the wafer W. Thus, as illustrated in FIG. 20, the hydrophilic polymer 411 is selectively removed from the wafer W (second polymer removal step, Step S13 in FIG. 6), whereby a hole-shaped pattern 412*a* having an inner diameter of 25 nm is formed in the hydrophobic polymer 412. In this event, the second block copolymer 410 inside the cylindrical hydrophobic polymers 405 is not removed but remains on the wafer W.

Figure 21:
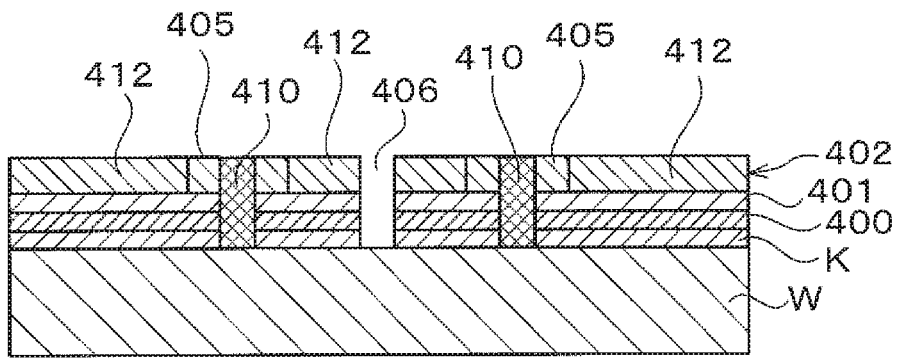
FIG. 21 An explanatory view of a longitudinal cross-section illustrating an appearance in which the film to be treated is subjected to an etching treatment.

Thereafter, the wafer W is carried again to the etching treatment apparatus (not illustrated) provided outside the substrate treatment system 1, and the neutral layer 401, the anti-reflection film 400, and the film to be treated K are subjected to an etching treatment using the hydrophobic polymers 405, 412 as a mask. Thus, a hole pattern 406 having the same diameter as that of the pattern 412*a* is transferred to the film to be treated K as illustrated in FIG. 21 (Step S14 in FIG. 6).

Figure 22:
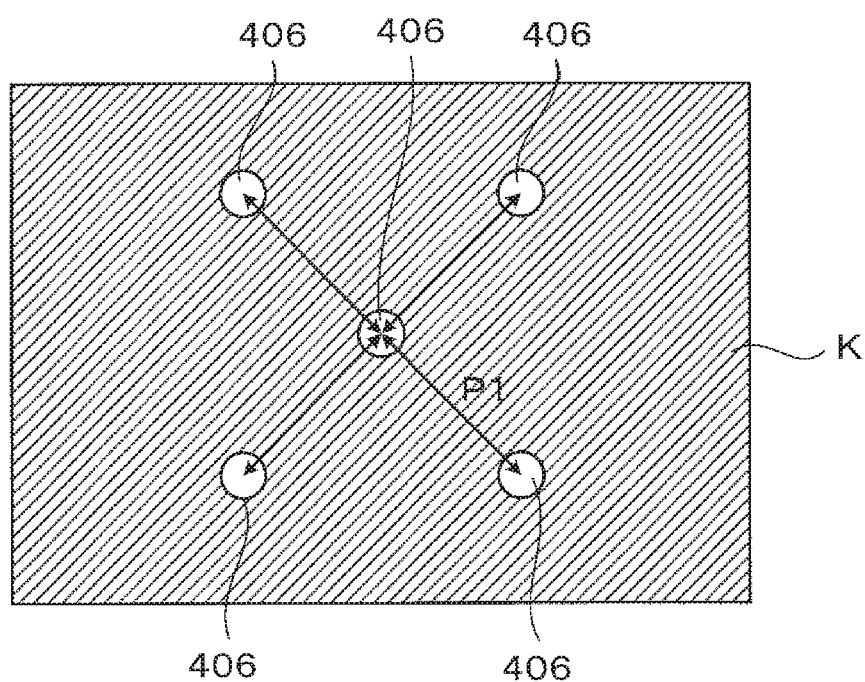
FIG. 22 An explanatory view of a plane illustrating an appearance in which predetermined patterns are formed in the film to be treated.
Figure 23:
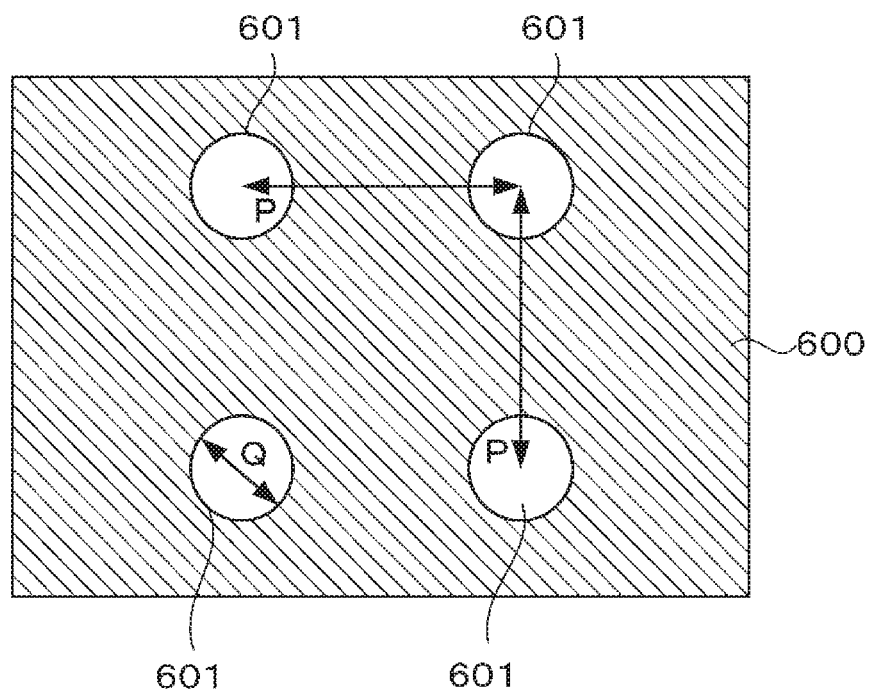
FIG. 23 An explanatory view of a plane illustrating an appearance in which hole patterns are formed of a resist film on the wafer in the conventional water treatment.
Figure 24:
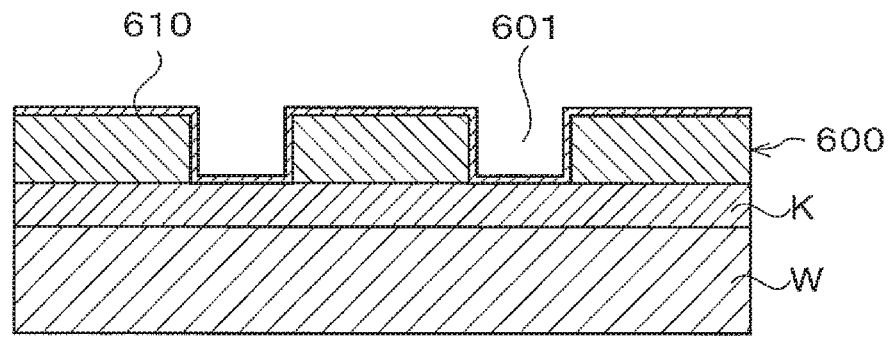
FIG. 24 An explanatory view of a longitudinal cross-section illustrating an appearance in which an oxide film is formed on the wafer in the conventional water treatment.
Figure 25:
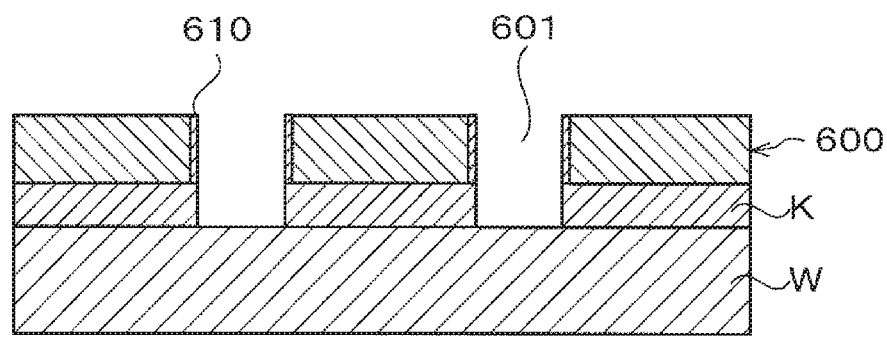
FIG. 25 An explanatory view of a longitudinal cross-section illustrating an appearance in which the patterns of the resist film are transferred to the film to be treated on the wafer in the conventional water treatment.
Figure 26:
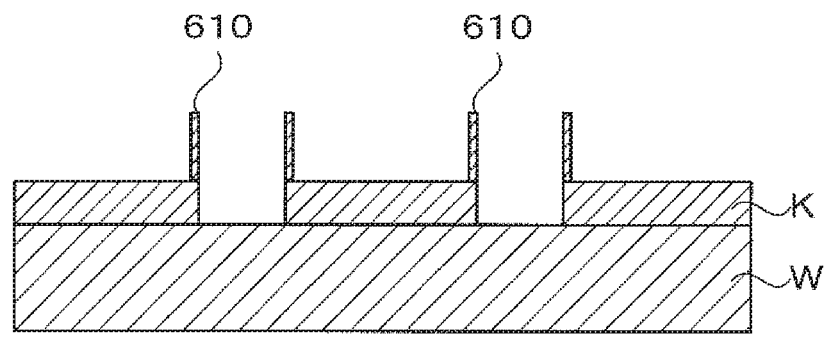
FIG. 26 An explanatory view of a longitudinal cross-section illustrating an appearance in which the resist film is selectively removed in the conventional water treatment.
Figure 27:
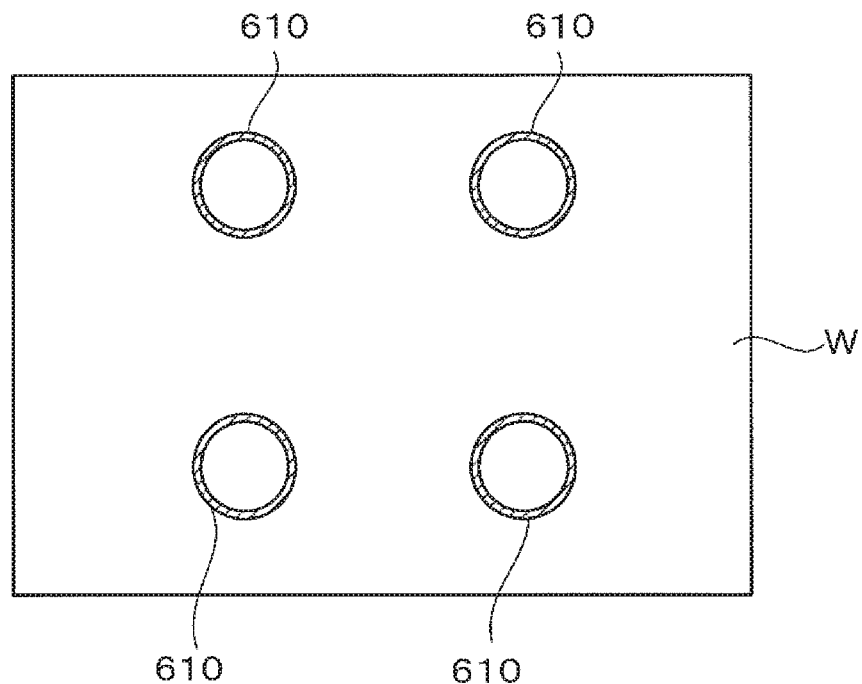
FIG. 27 An explanatory view of a plane illustrating an appearance in which the resist film is selectively removed in the conventional water treatment.

Thereafter, the wafer W is subjected again to an etching treatment, whereby the hydrophobic polymers 405, 412, the second block copolymer 410, the neutral layer 401, and the anti-reflection film 400 on the wafer W are removed. As a result, five hole patterns 406 adjacent to one another in diagonal 45° directions are formed in the film to be treated K on the wafer W as illustrated in FIG. 22. A pitch P1 between the hole patterns 406 is $1/\sqrt{2}$ times the pitch P between the hole portions 402a of the resist pattern 402 formed in Step S3, so that a narrower pitch using the block copolymer is realized. With this, a series of wafer treatment ends.

According to the above embodiment, the first block copolymer 403 having a ratio of the molecular weight of the hydrophilic polymer of 20% to 40% is applied to the wafer W after the formation of the resist pattern 402, and then the first polymer separation step (Step S5) and the first polymer removal step (Step S7) are performed, whereby the cylindrical hydrophobic polymers are formed in the hole portions 402a of the resist pattern 402. Then, by selectively removing the resist pattern 402 in Step S9, only the cylindrical hydrophobic polymers 405 remain on the wafer W. Then, the second block copolymer 410 is applied to the wafer W after removal of the resist and subjected to the second polymer separation step (Step S11), whereby the hydrophilic polymer 411 is phase-separated at a position equally spaced from the hydrophobic polymers 405 using the hydrophobic polymers 405 as guides. In this event, the hydrophobic polymers 405 are used as guides, and therefore the hydrophilic polymer 411 is never phase-separated on the surfaces of the guides, unlike the case of using the hydrophilic oxide film 610. As a result, it is possible to prevent gaps from being formed between the guides and the hydrophobic polymers 405, 412 as in the case of using the hydrophilic oxide films 610 as guides. Accordingly, for example, in the etching treatment thereafter, the hole patterns 406 with narrowed pitches can be formed in the film to be treated K without transfer of patterns of unnecessary gaps onto the film to be treated K.

Figure 28:
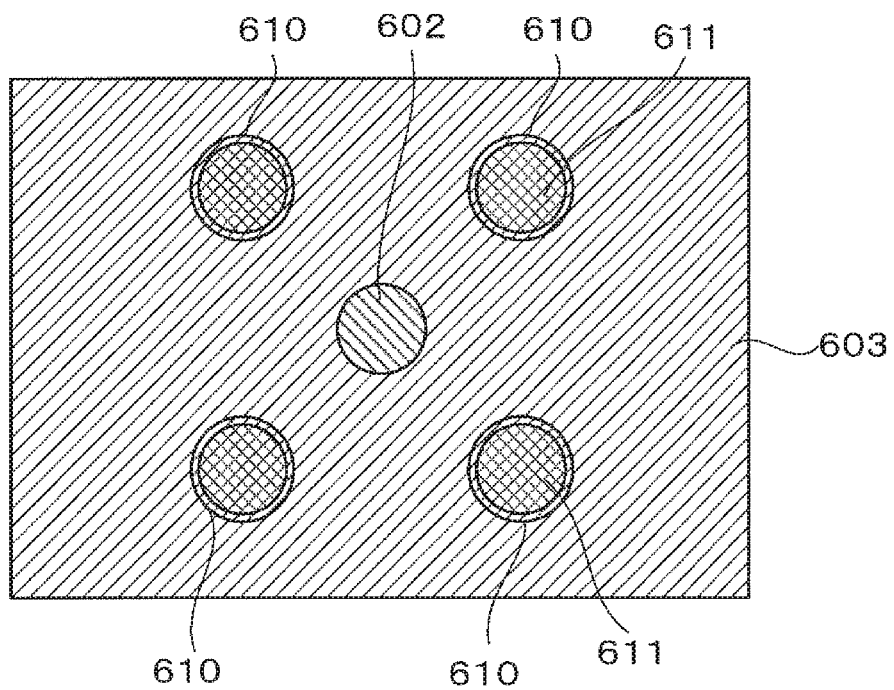
FIG. 28 An explanatory view of a longitudinal cross-section illustrating an appearance in which block copolymers are phase-separated into hydrophilic polymers and a hydrophobic polymer in the conventional water treatment.

Besides, in the case of using, for example, the oxide film 610 such as SiO2 as a guide when phase-separating the second block copolymer 410, the oxide film 610 being an inorganic substance has a high etching selection ratio with respect to the hydrophilic polymer and the hydrophobic polymer which are organic substances. In that case, for phase-separating the block copolymers 611 using the oxide films 610 as guides, for example, as illustrated in FIG. 28, performing an etching treatment using the hydrophobic polymer 603 as a mask, and then removing the hydrophobic polymer 603 and the oxide films 610 which become unnecessary any longer from the top of the wafer W, it is necessary to perform separate etching treatments on the hydrophobic polymer 603 and the oxide films 610. In this case, the throughput of the wafer treatment decreases. In contrast, the hydrophobic polymers 405 are used as guides in this embodiment, so that the hydrophobic polymers 405 and the hydrophobic polymer 412 which become unnecessary any longer can be removed by etching one time, eliminating occurrence of such a problem.

Besides, in the case of using the oxide films 610 as guides when phase-separating the second block copolymer 410, it is necessary to carry out the wafer W once to the outside the substrate treatment system 1 for formation of the oxide films 610 and perform a film forming treatment in a dedicated film forming apparatus. However, in the case of using the first block copolymers 403 as guides as in this embodiment, it is possible to perform all of the treatments for forming the guides in the substrate treatment system 1. Accordingly, the throughout when creating the guides on the wafer W can be improved.

In the above embodiment, the ultraviolet ray is applied to the wafer W and the polar organic solvent is then supplied thereto so as to selectively remove the hydrophilic polymers 404, 411 in the above embodiment, but the method of removing the hydrophilic polymers 404, 411 is not limited to the contents of this embodiment, and the hydrophilic polymers 404, 411 may be selectively removed using, for example, dry etching or the like.

Further, the resist pattern 402 is removed by performing the ashing processing thereon in Step S9 in the above embodiment, but the method of removing the resist pattern 402 is not limited to the contents of this embodiment. The present inventors have confirmed that even in the case of using either a negative developing resist or a positive developing resist, for example, as long as the resist has polarity, an ultraviolet ray having, for example, a wavelength of 172 nm is applied as an energy ray to the wafer W in Step S6 and an acetic acid is supplied thereto in place of the polar organic solvent in Step S7, whereby the resist pattern 402 is dissolved in addition to the hydrophilic polymers 404, and only the hydrophobic polymers remain on the neutral layer 401. Accordingly, for example, the developing apparatus 30 and the organic solvent supply apparatus 31 of the substrate treatment system 1 may be configured to be able to supply the acetic acid to the wafer W so that after the film to be treated K is subjected to a dry etching treatment using the resist pattern 402 and the hydrophobic polymers 405 as a mask in Step S8, the wafer W is then carried not to the ashing processing apparatus but to the substrate treatment system 1 and supplied with the acetic acid in the developing apparatus 30 and the organic solvent supply apparatus 31. This makes it possible to perform in the substrate treatment system 1 all of the treatments other than the dry etching, thereby improving the throughput of the wafer treatment. In this case, the developing apparatus 30 and the organic solvent supply apparatus 31 function as a resist removing apparatus that selectively removes the resist film. Note that the energy ray to be applied in Step S6 may be, for example, an electron ray in place of the ultraviolet ray.

Note that though the transfer of the patterns to the film to be treated K is performed divided in two steps of Step S8 and Step S14 in the above embodiment, for example, the etching treatment in Step S8 may be omitted and the transfer of the hole-shaped patterns 405a and 412a to the film to be treated K may be simultaneously performed in Step S14. The reason why the transfer of the patterns 405a and 412a is performed in a divided manner is that the second block copolymer 410 applied to the inside of the cylindrical hydrophobic polymers 405 in Step S10 cannot be removed in Step S13. More specifically, the neutral layer 401 and the second block copolymer 410 are each composed of the hydrophilic polymer and the hydrophobic polymer and therefore both of them are etched in Step S14 but have little or no difference in selection ratio according to the present inventors. Therefore, at the time when performing an etching treatment on the neutral layer 401 in Step S14, it is impossible to perform uniform etching at a portion corresponding to the pattern 412a where the neutral layer 401 is exposed and a portion corresponding to the pattern 405a where the second block copolymer 410 remains.

Hence, for example, a heat treatment temperature when forming the neutral layer 401 in Step S2 is set to, for example, a temperature (roughly about 300° C. to 400° C.)

higher than the heat treatment temperature when phase-separating the block copolymer, to thereby subject the neutral layer 401 to a cross-linking reaction so as to provide an etching selection ratio between the neutral layer 401 and the second block copolymer 410. This makes it possible to reduce nonuniformity in etching of the neutral layer 401, for example, even if the portions corresponding to the patterns 405a and the pattern 412a are simultaneously etched in Step S14.

Besides, for example, a metal hard mask may be provided at a base of the neutral layer 401. In this case, even if a selection ratio between the neutral layer 401 and the second block copolymer 410 is not secured, etching is stopped once at the metal hard mask. Accordingly, when patterns are transferred to the metal hard mask after the neutral layer 401 and the second block copolymer 410 are removed, the patterns can be continuously transferred to the film to be treated K using the metal hard mask, thereby making it possible to perform simultaneously an etching treatment on the portions corresponding to the patterns 405a and the pattern 412a in Step S14.

The first block copolymer 403 and the second block copolymer 410 are made to have different molecular weights of polymers in the above embodiment, but the first block copolymer 403 and the second block copolymer 410 may be the same. The molecular weights of the polymers contained in the block copolymer are decided, for example, by the diameter of the columnar hydrophilic polymer 404 formed in the first polymer separation step in Step S5 and the diameter of the columnar hydrophilic polymer 411 formed in the second polymer separation step in Step S11, and can be arbitrarily set within a range where the hydrophilic polymers 404, 411 and the hydrophobic polymers 405, 412 are properly phase-separated.

Though the case where the resist pattern 402 is formed such that the hole portions 402a for deciding the arrangement of the cylindrical hydrophobic polymers 405 serving as the guides are arranged in a square form is described as an example in the above embodiment, the arrangement of the hole portions 402a is not limited to the contents of this embodiment but may be, for example, a triangular arrangement or a hexagonal arrangement. By setting the ratio of the molecular weight of the hydrophilic polymer 411 in the second block copolymer 410 to about 20% to 40%, the columnar hydrophilic polymer 411 autonomously phase-separates and is arrayed at a position equally spaced from the surfaces of the guides, namely, at a position stable in energy. Therefore, the arrangement of the hole portions 402a are appropriately set in consideration of the position of the autonomously arrayed hydrophilic polymer 411.

Besides, though the pitch between the hole portions 402a is set so that one hydrophilic polymer 411 phase-separates at a position equally spaced from the four hole portions 402a in the above embodiment, the pitch between the hole portions 402a is not limited to the contents of this embodiment but can be arbitrarily set. Since the hydrophilic polymer 411 autonomously phase-separates at a position stable in energy as described above, it is possible to phase-separate a plurality of hydrophilic polymers 411 between the cylindrical hydrophobic polymers 405 as guides formed at positions corresponding to the hole portions 402a by increasing the pitch between the hole portions 402a.

Besides, as the method of narrowing the pitch P between the hole patterns 406 using the conventional photolithography technique, a so-called double patterning is known in which exposure processing and developing treatment are performed a plurality of times. In the double patterning, it is necessary to accurately perform, in the patterning in the second time or subsequent thereto, alignment to the patterning in the first time. In contrast to this, in the case of using the block copolymer as in this embodiment, the hydrophilic polymer 411 of the second block copolymer 410 autonomously phase-separates at a position stable in energy, namely, at a position equally spaced from the plurality of hydrophilic polymers 405 as guides. Accordingly, the alignment adjustment such as the conventional double patterning becomes unnecessary, and exposure processing only needs to be performed once for forming the hole portions 402a of the resist pattern 402, thereby very efficiently narrowing the pitch between the hole patterns.

Note that the hole portions 402a of the predetermined resist pattern 402 are used as the guides at the time when phase-separating the hydrophobic polymers 405 of the first block copolymer 403 in the above embodiment, but it is not always necessary to use the resist pattern 402 as the guide. The guide may be, for example, the neutral layer 401 or a polystyrene film to which the hole portions 402a of the resist pattern 402 are transferred, as long as it can phase-separate the first block copolymer 403 into the hydrophilic polymers 404 and the hydrophobic polymers 405 concentrically in the pattern.

The case where the hole patterns 406 are transferred to the film to be treated K on the wafer W is described as an example in the above embodiment, but the present invention is also applicable, for example, to a case where the wafer is subjected to etching and the hole patterns 406 are transferred onto the wafer W.

Besides, though the anti-reflection film 400 and the neutral layer 401 are formed as the base film of the resist pattern 402 in the above embodiment, these are not always necessary. In particular, the neutral layer 401 is used for arraying the hydrophilic polymers 404 and the hydrophobic polymers 405 along the normal direction to the wafer W when the block copolymer is phase-separated. Therefore, it is not always necessary to provide the neutral layer 401 as long as the base of the resist pattern 402 is neutral to the hydrophilic polymer and the hydrophobic polymer even in the case where the neutral layer 401 is not provided, or as long as even if the base is not neutral, the hydrophilic polymer 404 and the hydrophobic polymer 405 can be properly phase-separated. In this case, the base of the resist pattern 402, namely, the surface where the block copolymer 403 is applied may be, for example, the anti-reflection film 400.

A preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention. The present invention is not limited to the embodiment but can take various forms. The present invention is also applicable to the case where the substrate is a substrate other than the wafer, such as an FPD (Flat Panel Display), a mask reticle for a photomask or the like.

INDUSTRIAL APPLICABILITY

The present invention is useful in treating a substrate, for example, using a block copolymer containing a hydrophilic polymer having a hydrophilic property and a hydrophobic polymer having a hydrophobic property.

EXPLANATION OF CODES 1 substrate treatment system
30 developing apparatus 31 organic solvent supply apparatus
32 anti-reflection film forming apparatus
33 neutral layer forming apparatus
34 resist coating apparatus
35 block copolymer coating apparatus
40 thermal treatment apparatus
300 control unit
400 anti-reflection film
401 neutral layer
402 resist pattern
403 first block copolymer
404 hydrophilic polymer
405 hydrophobic polymer
406 hole pattern
410 second block copolymer
411 hydrophilic polymer
412 hydrophobic polymer
W wafer

What is claimed:

1. A substrate treatment method of treating a substrate using a block copolymer containing a hydrophilic polymer and a hydrophobic polymer, the substrate treatment method comprising:
   a resist pattern formation step of forming a plurality of circular patterns of a resist film on the substrate;
   a first block copolymer coating step of applying a first block copolymer to the substrate after the formation of the circular patterns of the resist film;
   a first polymer separation step of phase-separating the first block copolymer into the hydrophilic polymer and the hydrophobic polymer;
   a first polymer removal step of selectively removing the hydrophilic polymer from the phase-separated first block copolymer;
   a resist removal step of selectively removing the resist film from a top of the substrate;
   a second block copolymer coating step of applying a second block copolymer to the substrate after the removal of the resist;
   a second polymer separation step of phase-separating the second block copolymer into the hydrophilic polymer and the hydrophobic polymer; and
   a second polymer removal step of selectively removing the hydrophilic polymer from the phase-separated second block copolymer,
   wherein a ratio of a molecular weight of the hydrophilic polymer in the first block copolymer and the second block copolymer is 20% to 40%.

2. The substrate treatment method according to claim 1, further comprising:
   after the first polymer removal step, an etching treatment step of performing an etching treatment using the resist film and the hydrophobic polymer as a mask.

3. The substrate treatment method according to claim 2, further comprising:
   after the second polymer removal step, another etching treatment step of performing an etching treatment using the hydrophobic polymer as a mask.

4. The substrate treatment method according to claim 1, wherein the resist film is formed of a resist having a polarity.

5. The substrate treatment method according to claim 4, wherein the selective removal of the hydrophilic polymer in the first polymer removal step is performed by irradiating the substrate with an energy ray and then supplying a polar organic solvent onto the substrate between the first polymer separation step and the first polymer removal step.

6. The substrate treatment method according to claim 1, wherein the hydrophilic polymer is polymethyl methacrylate, and
   wherein the hydrophobic polymer is polystyrene.

7. The substrate treatment method according to claim 1, wherein the circular patterns formed of the resist film are arranged in a lattice form, a triangular form or a hexagonal form.

8. A computer-readable storage medium storing a program running on a computer of a control unit controlling a substrate treatment system to cause the substrate treatment system to perform a substrate treatment method of treating a substrate using a block copolymer containing a hydrophilic polymer and a hydrophobic polymer,
   the substrate treatment method comprising:
   a resist pattern formation step of forming a plurality of circular patterns of a resist film on the substrate;
   a first block copolymer coating step of applying a first block copolymer to the substrate after the formation of the circular patterns of the resist film;
   a first polymer separation step of phase-separating the first block copolymer into the hydrophilic polymer and the hydrophobic polymer;
   a first polymer removal step of selectively removing the hydrophilic polymer from the phase-separated first block copolymer;
   a resist removal step of selectively removing the resist film from a top of the substrate;
   a second block copolymer coating step of applying a second block copolymer to the substrate after the removal of the resist;
   a second polymer separation step of phase-separating the second block copolymer into the hydrophilic polymer and the hydrophobic polymer; and
   a second polymer removal step of selectively removing the hydrophilic polymer from the phase-separated second block copolymer,
   wherein a ratio of a molecular weight of the hydrophilic polymer in the first block copolymer and the second block copolymer is 20% to 40%.

9. A substrate treatment system of treating a substrate using a block copolymer containing a hydrophilic polymer and a hydrophobic polymer, the substrate treatment system comprising:
   a developing apparatus that develops a resist film after exposure processing formed on the substrate to form a resist pattern;
   a block copolymer coating apparatus that applies a first block copolymer and a second block copolymer to the substrate after the formation of the resist pattern;
   a polymer separation apparatus that phase-separates the first block copolymer and the second block copolymer into the hydrophilic polymer and the hydrophobic polymer;
   a polymer removing apparatus that selectively removes the hydrophilic polymer from the phase-separated first block copolymer and second block copolymer;
   a resist removing apparatus that selectively removes the resist film from a top of the substrate; and
   a control unit that controls the block copolymer coating apparatus, the polymer separation apparatus, the polymer removing apparatus, and the resist removing apparatus, the control unit being configured to control:
  the block copolymer coating apparatus to apply the first block copolymer to the substrate after a circular pattern is formed;
  the polymer separation apparatus to phase-separate the first block copolymer into the hydrophilic polymer and the hydrophobic polymer;
  the polymer removing apparatus to selectively remove the hydrophilic polymer after the phase-separation;
  the resist removing apparatus to selectively remove the resist film from the top of the substrate;
  the block copolymer coating apparatus to apply the second block copolymer to the substrate after the removal of the resist;
  the polymer separation apparatus to phase-separate the second block copolymer into the hydrophilic polymer and the hydrophobic polymer; and
  the polymer removing apparatus to selectively remove the hydrophilic polymer from the phase-separated second block copolymer,
wherein a ratio of a molecular weight of the hydrophilic polymer in the first block copolymer and the second block copolymer is 20% to 40%.

* * * * *